(12) United States Patent
Petrofsky

(10) Patent No.: US 6,359,576 B1
(45) Date of Patent: Mar. 19, 2002

(54) APPARATUS AND METHODS FOR PERFORMING RMS-TO-DC CONVERSION WITH BIPOLAR INPUT SIGNAL RANGE

(75) Inventor: Joseph G. Petrofsky, Cupertino, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 09/411,150

(22) Filed: Oct. 1, 1999

(51) Int. Cl.[7] .............................. H03M 3/00; H03M 1/06
(52) U.S. Cl. ........................................ 341/143; 341/118
(58) Field of Search ................................... 341/143, 118, 341/120, 150, 117; 327/348, 317; 375/252; 348/412

(56) References Cited

U.S. PATENT DOCUMENTS

| | | | | |
|---|---|---|---|---|
| 4,320,391 A | * | 3/1982 | Mallett et al. ............... | 341/117 |
| 5,065,157 A | * | 11/1991 | Ribner et al. ................ | 341/143 |
| 5,187,482 A | * | 2/1993 | Tiemann et al. ............. | 341/143 |
| 5,896,056 A | | 4/1999 | Glucina | |
| 5,949,361 A | * | 9/1999 | Fischer et al. ............... | 341/143 |
| 5,977,894 A | * | 11/1999 | McCarroll et al. ........... | 341/120 |

OTHER PUBLICATIONS

"Digest of Technical Papers", *ISSCC*, First Edition, pp. 398–399, 483, 338–339, Feb. 1999.

Steven R. Norsworthy et al., editors, "Delta–Sigma Data Converters," *IEEE Press*, pp. 24–26, 80–104, 193–218, 1997.

Analog Devices 1992 Special Linear Reference Manual, pp. 4–39 to 4–46, 1992.

Linear Technology Corporation 1990 Linear Databook, pp. 11–33 to 11–44, copyright 1989.

Dan Harres, "Pulse–modulated divider suits multichannel systems," *EDN Magazine*, 35:6, pp. 159–166, Mar. 1990.

C. Toumazou et al, eds, "Analogue IC Design: The Current–Mode Approach," pp. 39–43, 453–455, 468–472, 1990.

Wei–Shinn Wey and Yu–Chung Huang, "A CMOS Delta–Sigma True RMS Converter," *IEEE Journal of Solid–State Circuits*, vol. 35, No. 2, pp. 248–257, Feb. 2000.

\* cited by examiner

Primary Examiner—Patrick Wamsley
(74) Attorney, Agent, or Firm—Fish & Neave; Robert W. Morris

(57) ABSTRACT

The invention provides methods and apparatus for performing RMS-to-DC conversion of input signals that have a bipolar input signal range, the methods and apparatus providing an input-output transfer gain substantially equal to unity (1.0) or other integer value. Apparatus of the invention do not require a preceding absolute value circuit, and include a modulator and a demodulator that may be implemented on a single integrated circuit and may use switched-capacitor technology.

86 Claims, 19 Drawing Sheets

US 6,359,576 B1

APPARATUS AND METHODS FOR PERFORMING RMS-TO-DC CONVERSION WITH BIPOLAR INPUT SIGNAL RANGE

BACKGROUND OF THE INVENTION

The present invention relates to apparatus and methods for providing an output signal proportional to the root-mean-square (RMS) value of an input signal. More particularly, the present invention relates to apparatus and methods for providing an output signal proportional to the RMS value of an input signal having a bipolar signal range. The output signal may be a continuous-time direct current (DC) signal proportional to the RMS value of an input signal (commonly called RMS-to-DC conversion), or may be a digital signal that has a value that is proportional to the RMS value of an input signal.

The RMS value of a waveform is a measure of the heating potential of the waveform. RMS measurements allow the magnitudes of all types of voltage (or current) waveforms to be compared to one another. Thus, for example, an alternating current (AC) waveform having a value of 1 volt RMS produces the same amount of heat in a resistor as a 1 volt DC voltage.

Mathematically, the RMS value of a signal V is defined as:

$$V_{rms} = \sqrt{\overline{V^2}} \quad (1)$$

which involves squaring the signal V, computing the average value (represented by the overbar in equation (1)), and then determining the square root of the result.

Various previously known techniques have been used to measure RMS values. In one previously known technique, an applied signal is converted to heat, and a DC output signal is generated that has the same heat potential as the applied signal. For example, the LT1088 Wideband RMS-DC Converter Building Block (LT1088), from Linear Technology Corporation, Milpitas, Calif., may be used with external circuitry (e.g., two matched resistors and an opamp) to provide a thermally-based RMS-to-DC converter circuit. In particular, the LT-1088 includes a first heater having first and second terminals thermally coupled to a first temperature sensing diode, and a second heater having first and second terminals thermally coupled to a second temperature sensing diode. The first heater and first temperature sensing diode are thermally isolated from the second heater and second temperature sensing diode.

An RMS-to-DC converter circuit may be provided using the LT-1088 by coupling: (1) an input signal to the first terminal of the first heater; (2) the second terminals of the first and second heaters and the cathode terminals of the first and second temperature sensing diodes to GROUND; (3) the anode terminal of the first temperature sensing diode to an inverting input of an external opamp and through a first external resistor to a positive power supply (e.g., V+); (4) the anode terminal of the second temperature sensing diode to a non-inverting input of the external opamp and through a second external resistor to V+; and (5) the output of the external opamp to the first terminal of the second heater. The first heater converts the input signal to heat, and the second heater converts the output signal to heat. The external opamp provides a DC output signal having the same heat potential as the input signal.

Thermal techniques such as converter circuits that include the LT1088 provide an accurate result and provide a very high input signal bandwidth. The heaters and temperature sensitive diodes included on the LT1088, however, are sensitive to temperature gradients caused by other circuitry. Therefore, it is difficult to include other circuits (e.g., the opamp or the first and second resistors) on the same die as the circuit inside the LT1088, because the other circuitry would generate temperature gradients that would affect the temperature sensitive diodes. As a result, the LT1088 must be combined with external circuitry to form an RMS-to-DC converter circuit, and it is difficult to implement such thermally-based RMS-to-DC converter circuits on a single integrated circuit.

Another previously known technique for measuring RMS values utilizes the exponential current-voltage relationship of a forward-biased semiconductor junction, and commonly is referred to as log-antilog RMS-to-DC conversion. In particular, a transconductance circuit converts an input voltage to an input current, a first forward-biased semiconductor junction conducts the input current and produces a first voltage (proportional to the natural logarithm of the input current), a multiplier circuit doubles the first voltage (equivalent to squaring the input current), a lowpass filter provides a second voltage proportional to the average value of the first voltage, a divider circuit halves the second voltage (equivalent to taking the square-root of the averaged, squared input current), and the halved second voltage is applied across a second forward-biased semiconductor junction to produce an output current proportional to the square-root of the average of the squared input current.

Because the input to any logarithm computation must be positive, conventional log-antilog RMS-to-DC converter circuits require a preceding absolute value circuit to assure that the input current remains positive. Because the heating potential of a signal depends on the signal amplitude and not the signal polarity, the absolute value operation ideally does not alter the RMS value of the signal.

Log-antilog RMS-to-DC converters, however, have several disadvantages. First, the amplitude of the signals conducted by the forward-biased semiconductor junctions are much smaller than conventional signal levels. As a result, all errors caused by component tolerances, thermal drift, mechanical stress and other factors are enhanced. Second, an absolute value circuit is difficult to implement because the circuit typically contributes offset, polarity gain mismatch and frequency-dependent and amplitude-dependent errors. Third, actual forward-biased semiconductor junctions have current-voltage relationships that deviate from an ideal exponential relationship, and therefore further limit the accuracy of the RMS-to-DC converter circuit.

Another known RMS-to-DC converter circuit is described in U.S. Pat. No. 5,896,056 to Glucina, the disclosure of which is incorporated by reference in its entirety. FIG. 1 illustrates an exemplary embodiment of Glucina's RMS-to-DC converter circuits. In particular, circuit 10 includes rectifier 12, modulator 14, demodulator 16, lowpass filter 18, and optional gain stages 20 and 22. Gain stage 20 has a gain A and gain stage 22 has a gain B. Gain stages 20 and 22 may be included together, included individually, or omitted entirely from circuit 10. Rectifier 12 is coupled to input signal $V_{IN}$ and provides rectified output signal $V_Y$. $V_{IN}$ is a bipolar signal, i.e., $V_{IN}$ has an instantaneous magnitude that may be positive or negative. Rectifier 12 converts $V_{IN}$ to time-varying signal $V_Y$ that is a monopolar signal, i.e., $V_Y$ has an instantaneous magnitude that is only positive or only negative. $V_Y$ ideally is the instantaneous absolute value of $V_{IN}$, and the RMS value of $V_Y$ ideally equals the RMS value of $V_{IN}$:

$$\sqrt{+e, ovs\ \overline{V_{IN}^2}} + ee = \sqrt{+e, ovs\ \overline{V_Y^2}} + ee \quad (2)$$

where $\overline{V_{IN}^2}$ is the mean value of $V_{IN}^2$, and $\overline{V_Y^2}$ is the mean value of $V_Y^2$.

Modulator 14 is a pulse code modulator that has a monopolar input signal range and has an input terminal coupled to $V_Y$, a reference terminal coupled to the output of gain stage 22, and an output terminal that provides pulse code modulated (PCM) output signal D having a duty ratio equal to the ratio of $V_Y$ to $B \times V_{OUT}$:

$$D = \frac{V_Y}{B \times V_{OUT}} \quad (3)$$

An example of a pulse modulator used to implement a division function is described, for example, by Dan Harres, "Pulse Modulated Divider Suits Multichannel Systems," EDN, Mar. 15, 1990 (hereinafter referred to as "Harres"). An implementation of a division function using a pulse modulator also is described in more detail below.

PCM output signal D may, for example, comprise a stream of binary pulses, wherein each pulse is a binary signal (e.g., a digital signal having values LOW and HIGH) having a fixed pulse period. The duty ratio over a predetermined interval (e.g., 10 pulse periods) equals the ratio of the number pulses having a value HIGH during that interval to the total number of pulse periods during that interval. Thus, for example, if a pulse stream contains 4 pulses having a value HIGH during an interval of 10 pulse periods, the duty ratio equals 4/10=40%.

For high accuracy, modulator 14 may be implemented using an oversampling Δ-Σ pulse code modulator, as is known in the art. Δ-Σ modulators advantageously provide inherently good linearity and accuracy that is set by oversampling ratios. For example, with an over-sampling ratio of 2000:1, a first-order Δ-Σ modulator has a signal-to-noise ratio that approaches 90 dB. Δ-Σ modulators, however, also have imperfections called limit cycles and idle tones that degrade performance.

Demodulator 16 has a monopolar input signal range and has an input terminal coupled to $V_Y$, a control terminal coupled to modulator output signal D, and an output terminal that provides demodulator output signal $V_X$ that is proportional to the product of $V_Y$ and the duty ratio of PCM output signal D. In particular. demodulator 16 may comprise a switch that "chops" $V_Y$ at a rate controlled by PCM output signal D. As a result, demodulator output signal $V_X$ has a magnitude equal to the product of $V_Y$ and D:

$$V_X = D \times V_Y = \frac{V_Y}{B \times V_{OUT}} \times V_Y = \frac{V_Y^2}{B \times V_{OUT}} \quad (4)$$

An example of such a demodulator circuit is described in Harres.

The duty ratio of PCM output signal D must be within the range 0% to 100%. Because the duty ratio of D is proportional to the ratio of $V_Y$ to $V_{OUT}$, and because $V_{OUT}$ must be positive, the lower limit (i.e., D=0%) requires that $V_Y$ must be greater than or equal to zero. The upper limit (i.e., D=100%) requires that the peak magnitude of $V_Y$ not exceed $B \times V_{OUT}$.

Lowpass filter 18 has a monopolar input signal range and provides output $V_Z$ equal to the time average of input signal $V_X$. Lowpass filter 18 has a narrow passband, such that $V_Z$ is a quasi-static DC voltage that may be expressed as:

$$V_z = \text{AVG}\left(\frac{V_Y^2}{B \times V_{OUT}}\right) \quad (5)$$

where AVG represents the time average.

Output signal $V_{OUT}$ equals:

$$V_{OUT} = A \times V_z = A \times \text{AVG}\left(\frac{V_Y^2}{B \times V_{OUT}}\right) \quad (6)$$

Because $V_Z$ is a quasi-static DC value, $V_{OUT}$ also is a quasi-static DC value that has a time average approximately equal to $V_{OUT}$. As a result, equation (6) can be written as:

$$V_{OUT} = \frac{A}{B} \times \frac{\overline{V_Y^2}}{V_{OUT}} \quad (7)$$

where $\overline{V_Y^2}$ is the time-average of $V_Y^2$. Equation (7) may be re-written as:

$$V_{OUT}^2 = A/B \times \overline{V_Y^2} \quad (8)$$

According, $V_{OUT}$ equals:

$$V_{OUT} = \sqrt{\frac{A}{B}} \times \sqrt{\overline{V_Y^2}} = \sqrt{\frac{A}{B}} \times \sqrt{\overline{V_{IN}^2}} \quad (9a)$$

$$= \sqrt{\frac{A}{B}} \times V_{RMS} \quad (9b)$$

The overall gain of circuit 10 equals $V_{OUT}/V_{RMS}$, which equals the square root of A/B.

Absolute value circuit 12 provides an output $V_Y$ equal to the absolute value of input $V_{IN}$, so that the input to modulator always is non-negative. Absolute value circuits, however, are difficult to implement and may impose gain errors and speed limitations that may degrade the performance of circuit 10, particularly the accuracy with which output $V_{OUT}$ of circuit 10 approximates the value shown in equation (9b).

In addition, circuit 10 is not easily implemented in integrated circuit form. In particular, if modulator 14 is a Δ-Σ modulator, the circuit is best implemented in complementary metal oxide semiconductor (CMOS) technology. Absolute value circuit 12, however, is best implemented in bipolar technology. Thus, it is difficult to fabricate circuit 10 as a single integrated circuit in a single technology.

Thus, to improve Glucina's circuits, it would be desirable to provide methods and apparatus for performing RMS-to-DC conversion of input signals having a bipolar signal range.

It also would be desirable to provide methods and apparatus for performing RMS-to-DC conversion that do not require a preceding absolute value circuit.

It also would be desirable to provide methods and apparatus for performing RMS-to-DC conversion with converter circuits that can be implemented using a single integrated circuit technology.

It still further would be desirable to provide methods and apparatus for performing RMS-to-DC conversion with converter circuits implemented using a CMOS technology.

It also would be desirable to provide methods and apparatus for performing RMS-to-DC conversion with converter circuits implemented using digital circuitry.

It still further would be desirable to provide methods and apparatus for performing RMS-to-DC conversion with converter circuits implemented using switched-capacitor circuitry.

It further would be desirable to provide methods and apparatus for performing RMS-to-DC conversion with converter circuits that include Δ-Σ modulators, but that reduce or eliminate limit cycles and idle tones.

SUMMARY OF THE INVENTION

Accordingly, it is an object of this invention to provide methods and apparatus for performing RMS-to-DC conversion of input signals having a bipolar signal range.

It also is an object of this invention to provide methods and apparatus for performing RMS-to-DC conversion that do not require a preceding absolute value circuit.

It also is an object of this invention to provide methods and apparatus for performing RMS-to-DC conversion with converter circuits that can be implemented using a single integrated circuit technology.

It still further is an object of this invention to provide methods and apparatus for performing RMS-to-DC conversion with converter circuits implemented using a CMOS technology.

It also is an object of this invention to provide methods and apparatus for performing RMS-to-DC conversion with converter circuits implemented using digital circuitry.

It further is an object of this invention to provide methods and apparatus for performing RMS-to-DC conversion with converter circuits implemented using switched-capacitor circuitry.

It further is an object of this invention to provide methods and apparatus for performing RMS-to-DC conversion with converter circuits that include Δ-Σ modulators, but that reduce or eliminate limit cycles and idle tones.

In accordance with these and other objects of the present invention, converter circuits in accordance with this invention include a pulse modulator and a demodulator each having a bipolar input signal range. The pulse modulator may be any commonly known pulse modulator, such as a pulse code modulator, pulse width modulator, or other similar modulator. Preferably, the pulse modulator is a single-bit oversampling Δ-Σ pulse code modulator. If the modulator is a Δ-Σ pulse code modulator, the demodulator may be implemented using a multiplying digital-to-analog converter.

Converter circuits in accordance with this invention may include first and second gain stages, the first gain stage provided in an input signal path of the pulse modulator, the second gain stage provided in an input or output signal path of the demodulator, the first and second gain stages providing first and second gains, respectively, the first and second gains selected so that the overall gain of the converter substantially is unity (1.0) or other integer value. In addition, the modulator may be a Δ-Σ modulator and the first and second gains may be selected to minimize idle tones and limit cycles in the modulator.

Converter circuits in accordance with this invention may be implemented on a single integrated circuit, using continuous-time, switched-capacitor, or digital circuitry, or using combinations of such circuitry. In particular, converter circuits of this invention may be implemented using switched-capacitor CMOS technology.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF THE INVENTION

The present invention improves upon Glucina's RMS-to-DC converter circuits. In particular, converter circuits constructed in accordance with the present invention have a bipolar input signal range and do not require an absolute value circuit that precedes the converter. In addition, the overall gain of the converter circuits may be set substantially equal to unity (1.0) or some other integer value, and may be set to values that minimize errors in converter circuits implemented using Δ-Σ pulse code modulators. RMS-to-DC converter circuits in accordance with this invention may be implemented in single-ended or differential circuitry, using continuous-time and/or switched-capacitor circuitry. Alternatively, RMS-to-DC converter circuits in accordance with this invention may be implemented using digital circuitry.

First, the specification describes an improvement to Glucina's circuit that permits a bipolar input signal range without an absolute value circuit. Second, the specification describes how the gain stages may be configured to permit an accurate overall gain substantially equal to unity (1.0) or some other integer value. Third, the specification describes various alternative embodiments, including converters that use differential circuitry, delay-compensation and cascaded Δ-Σ modulators. Finally, the specification describes fully digital circuit implementations.

Figure 1:
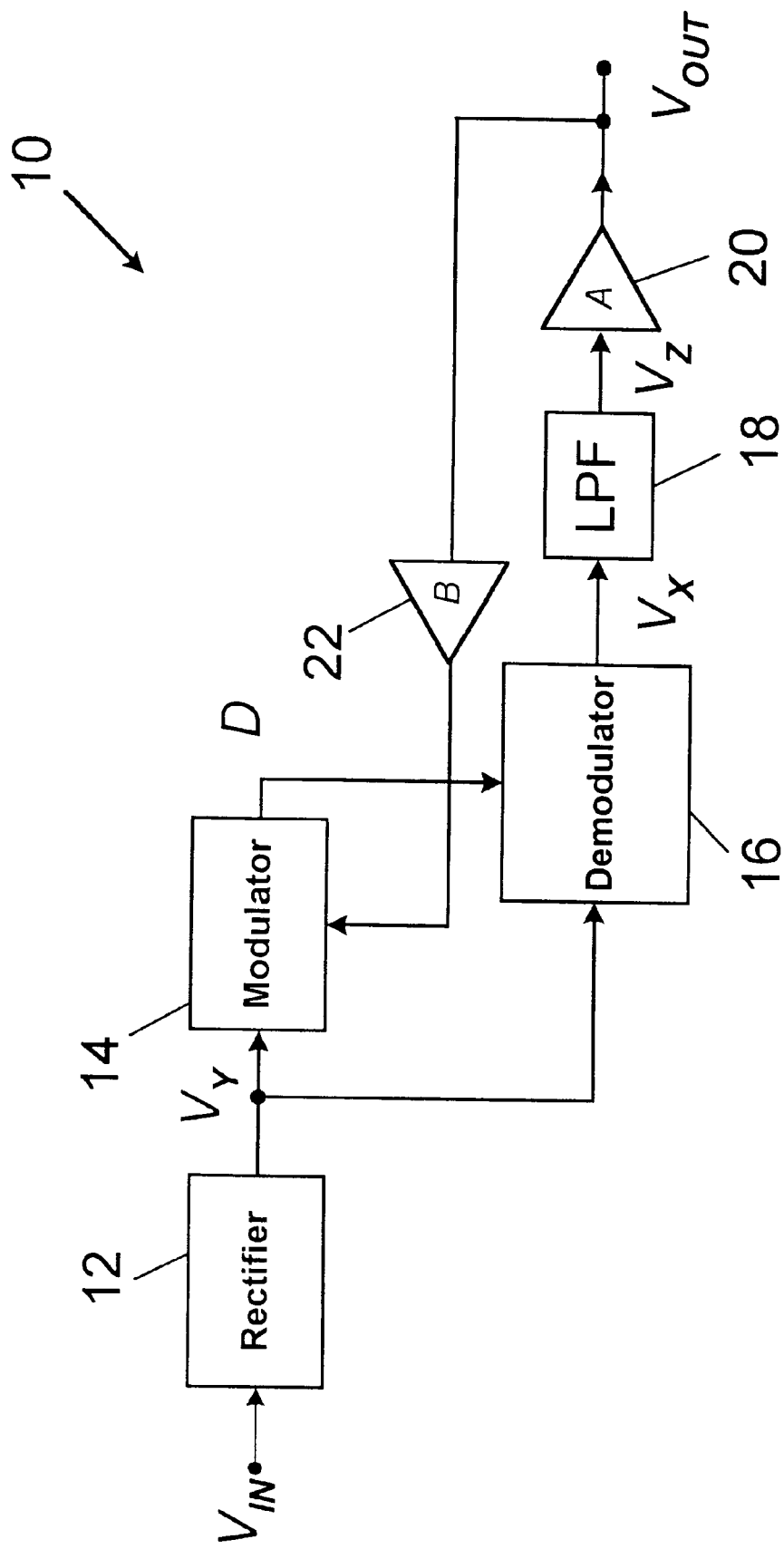
FIG. 1 is a schematic diagram of a previously known RMS-to-DC converter circuit.
Figure 2A:
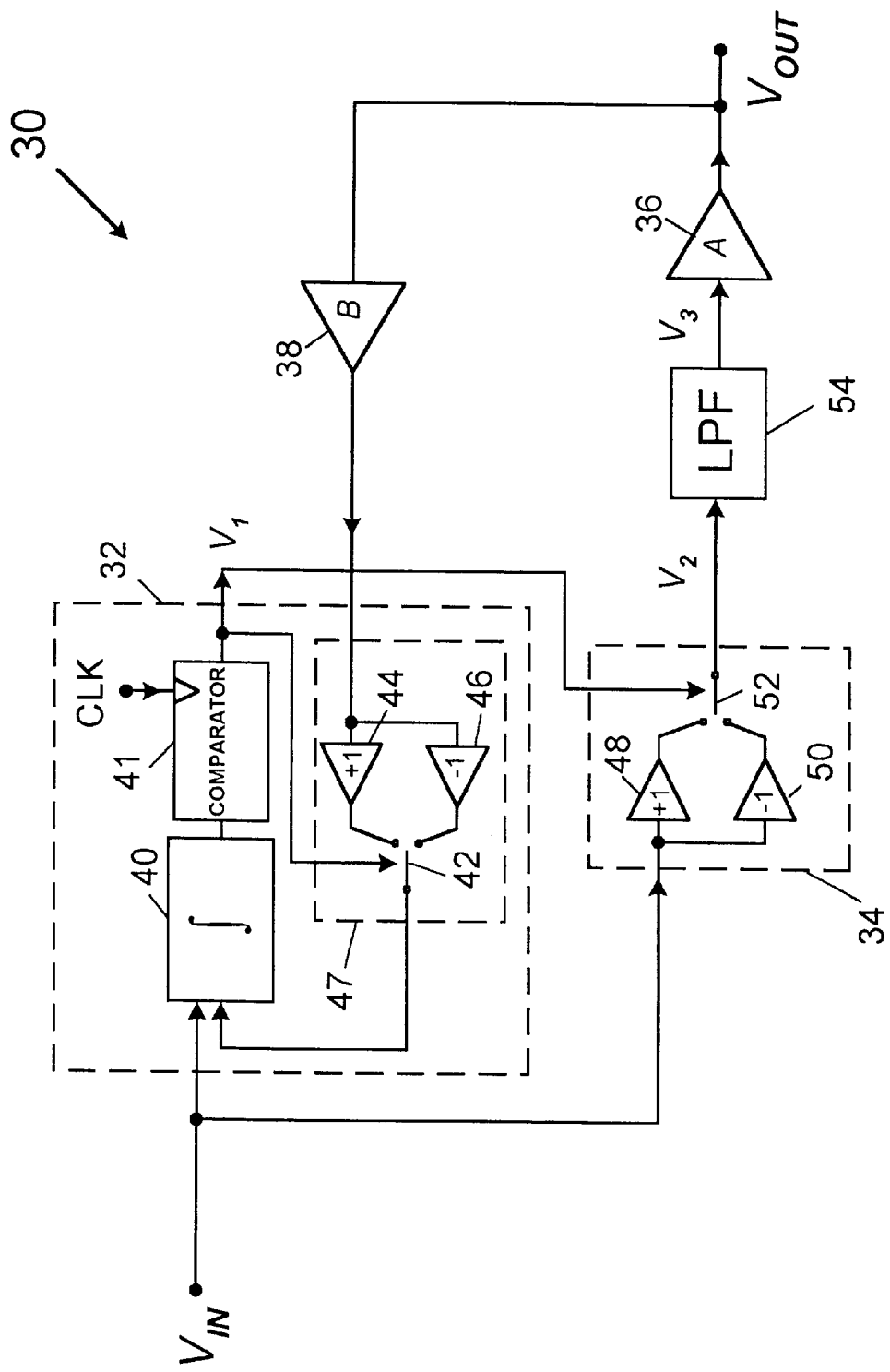
FIG. 2A is a schematic diagram of an RMS-to-DC converter circuit of the present invention.

Referring to FIG. 2A, an illustrative embodiment of an RMS-to-DC converter circuit in accordance with the present invention is described. Circuit 30 includes pulse modulator 32, demodulator 34, gain stage 36, gain stage 38 and lowpass filter 54. Pulse modulator 32 has a first input coupled to $V_{IN}$, a second input coupled to the output of gain stage 38 and an output $V_1$. Demodulator 34 has an input coupled to $V_{IN}$, a control input coupled to $V_1$, and an output $V_2$. Gain stage 38 has an input coupled to $V_{OUT}$, and provides a broadband gain B. Lowpass filter 54 has an input coupled to $V_2$ and an output $V_3$ coupled to the input of gain stage 36. Gain stage 36 has an output $V_{OUT}$, and provides a broadband gain A.

To simplify the description of pulse modulator 32 and demodulator 34, the following discussion first assumes that A=B=1. As described below, this assumption only affects a scale factor in the resulting analysis. Pulse modulator 32 may be any commonly known pulse modulator, such as a pulse code modulator, pulse width modulator, or other similar modulator. As shown in FIG. 2A, pulse modulator 32 preferably is implemented as a single-bit oversampling Δ-Σ pulse code modulator, and includes integrator 40, comparator 41, switch 42, non-inverting buffer 44 and inverting buffer 46. As described in more detail below, switch 42 and buffers 44 and 46 form a single-bit multiplying digital-to-analog converter (MDAC) 47.

Integrator 40 has a first input coupled to input $V_{IN}$, a second input coupled to the pole of switch 42, and an output coupled to an input of comparator 41. Comparator 41 has a clock input coupled to clock signal CLK, and an output $V_1$ coupled to control terminals of switches 42 and 52. Clock CLK is a fixed period clock that has a frequency that is much higher than the frequency of input $V_{IN}$ (e.g., 100 times greater). Comparator 41 compares the signal at the output of integrator 40 to a reference level (e.g., GROUND), and latches the comparison result as output signal $V_1$ on an edge of clock CLK.

Non-inverting buffer 44 provides unity gain (i.e., +1.0) and has an input coupled to the output of gain stage 38, and an output coupled to the first terminal of switch 42. Inverting buffer 46 provides inverting gain (i.e., –1.0) and has an input coupled to the output of gain stage 38, and an output coupled to the second terminal of switch 42.

$V_1$ is a signal having a binary output level (e.g., –1 or +1). If $V_1$=–1, the pole of switch 42 is coupled to the output of non-inverting buffer 44. That is, (assuming gain B=1) $+V_{OUT}$ is coupled to the second input of integrator 40. Alternatively, if $V_1$=+1, the pole of switch 42 is coupled to the output of inverting buffer 46. That is, (assuming gain B=1) $-V_{OUT}$ is coupled to the second input of integrator 40. This switching configuration provides negative feedback in pulse modulator 32.

The first and second inputs of integrator 40 therefore can have values equal to:

$$-V_{OUT} \leq V_{IN} \leq V_{OUT} \quad (10)$$

and $V_{IN}$ thus has a bipolar input signal range without requiring an absolute value circuit.

From equation (10), if $V_1$ has a duty ratio D" between 0–100%, D" can be expressed as:

$$D'' = \frac{1}{2} \times \left(\frac{V_{IN}}{V_{OUT}}\right), 0 \leq D'' \leq 1 \quad (11)$$

That is, if $V_{IN}$=–$V_{OUT}$, D"=0, and if $V_{IN}$=+$V_{OUT}$, D"=1.

Demodulator 34 includes non-inverting buffer 48, inverting buffer 50 and switch 52, which form a single-bit MDAC. Non-inverting buffer 48 has an input coupled to $V_{IN}$, and an output coupled to a first terminal of switch 52. Inverting buffer 50 has an input coupled to $V_{IN}$, and an output coupled to a second terminal of switch 52. Switch 52 has a control terminal coupled to $V_1$ and a pole coupled to the input of lowpass filter 54.

If $V_1$=+1, the pole of switch 52 is coupled to the output of non-inverting buffer 48. That is, $+V_{IN}$ is coupled to the input of lowpass filter 54. Alternatively, if $V_1$=–1, the pole of switch 52 is coupled to the output of inverting buffer 50. That is, $-V_{IN}$ is coupled to the input of lowpass filter 54.

Demodulator 34 provides an output signal $V_2$ at the pole of switch 52 that may be expressed as:

$$V_2 = +V_{IN} \times D'' - (V_{IN}) \times (D'' - 1) \quad (12a)$$

$$= V_{IN} \times (2 \times D'' - 1) \quad (12b)$$

Substituting equation (11) into equation (12b), $V_2$ is given by:

$$V_2 = \frac{V_{IN}^2}{V_{OUT}} \quad (13)$$

Lowpass filter 54 may be a continuous-time or a discrete-time filter, and provides an output $V_3$ equal to the time average of input $V_2$. Accordingly, $V_3$ equals:

$$V_3 = \frac{\overline{V_{IN}^2}}{V_{OUT}} \quad (14)$$

Gain stage 36 provides an output $V_{OUT}$ equal to (assuming gain A=1) $V_3$:

$$V_{OUT} = \frac{\overline{V_{IN}^2}}{V_{OUT}} \quad (15a)$$

$$= \sqrt{\overline{V_{IN}^2}} = V_{RMS} \quad (15b)$$

Thus, circuit 30 has a bipolar input range and provides an output $V_{OUT}$ equal to the RMS value of input $V_{IN}$.

Demodulator 34 and stage 47 each are single-bit MDACs and comparator 41 is a single-bit analog-to-digital converter (ADC) that provides a single-bit output $V_1$. The difference between the output of integrator 40 and MDAC 47 equals the quantization error e[i] of pulse modulator 32.

Figure 2B:
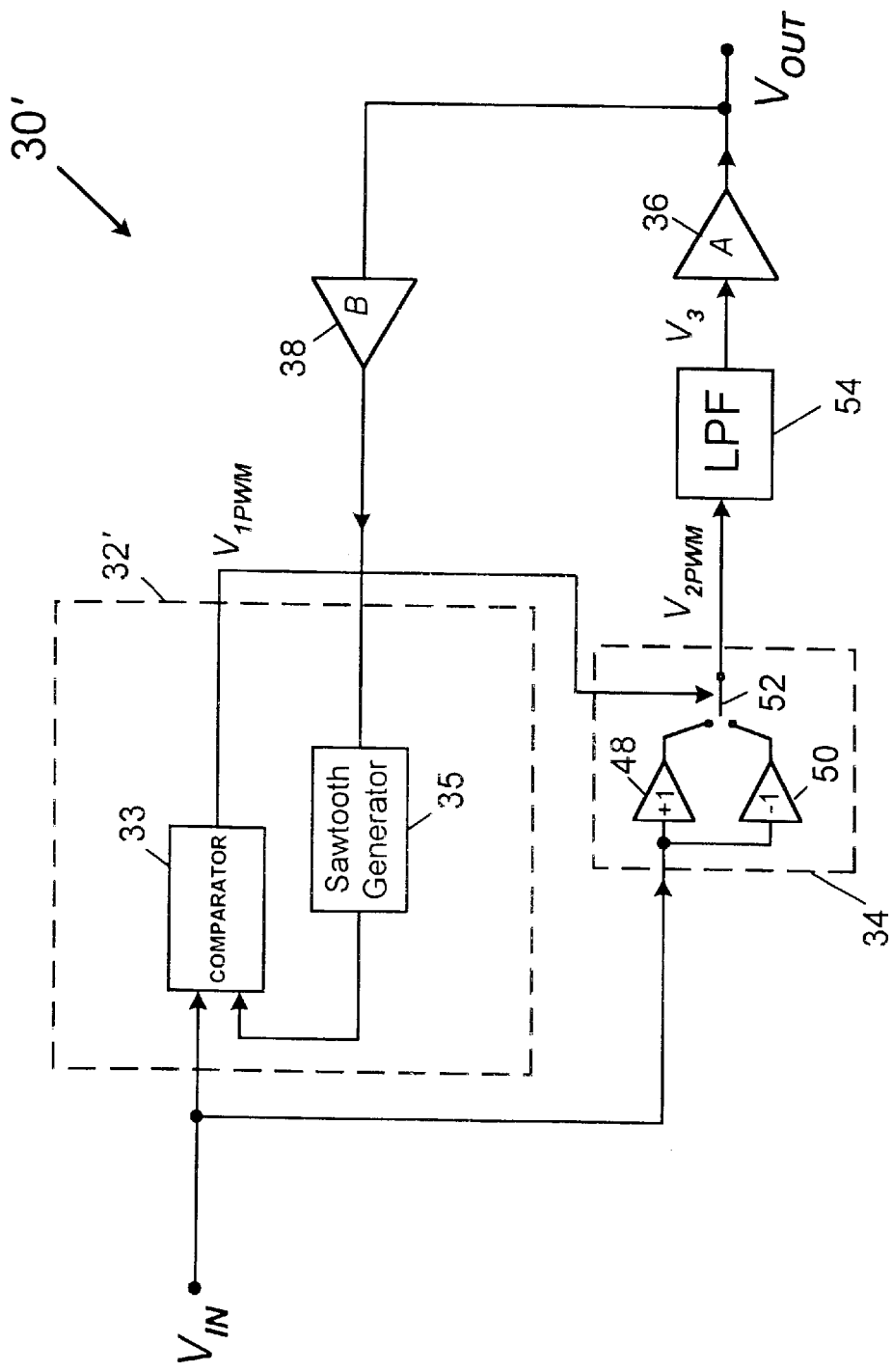
FIG. 2B is another schematic diagram of an RMS-to-DC converter circuit of the present invention.

As described above, pulse modulator 32 preferably is a single-bit oversampling Δ-Σ pulse code modulator. Pulse modulator 32 alternatively may be implemented using other pulse modulators. As shown in FIG. 2B, RMS-to-DC converter 30' includes pulse width modulator 32', which includes comparator 33 and sawtooth generator 35. Comparator 33 has a first input coupled to $V_{IN}$, a second input coupled to the output of sawtooth generator 35, and provides pulse width modulated output $V_{1PWM}$. Sawtooth generator 35 has an input coupled to the output of gain stage 38, and provides a sawtooth output having a fixed frequency much higher than the frequency of input $V_{IN}$ (e.g., 100 times greater), and maximum and minimum peak amplitudes of (assuming gain B=1) $+V_{OUT}$ and $-V_{OUT}$, respectively.

Comparator 33 compares $V_{IN}$ to the signal at the output of sawtooth generator 35, and provides pulse width modulated output signal $V_{1PWM}$, which is a signal having a binary output level (e.g., −1 or +1), and a duty cycle given by equation 11, above. In all other respects, circuit 30' operates similarly to circuit 30, except that input signal $V_{IN}$ to circuit 30' must be a continuous time signal.

Figure 3:
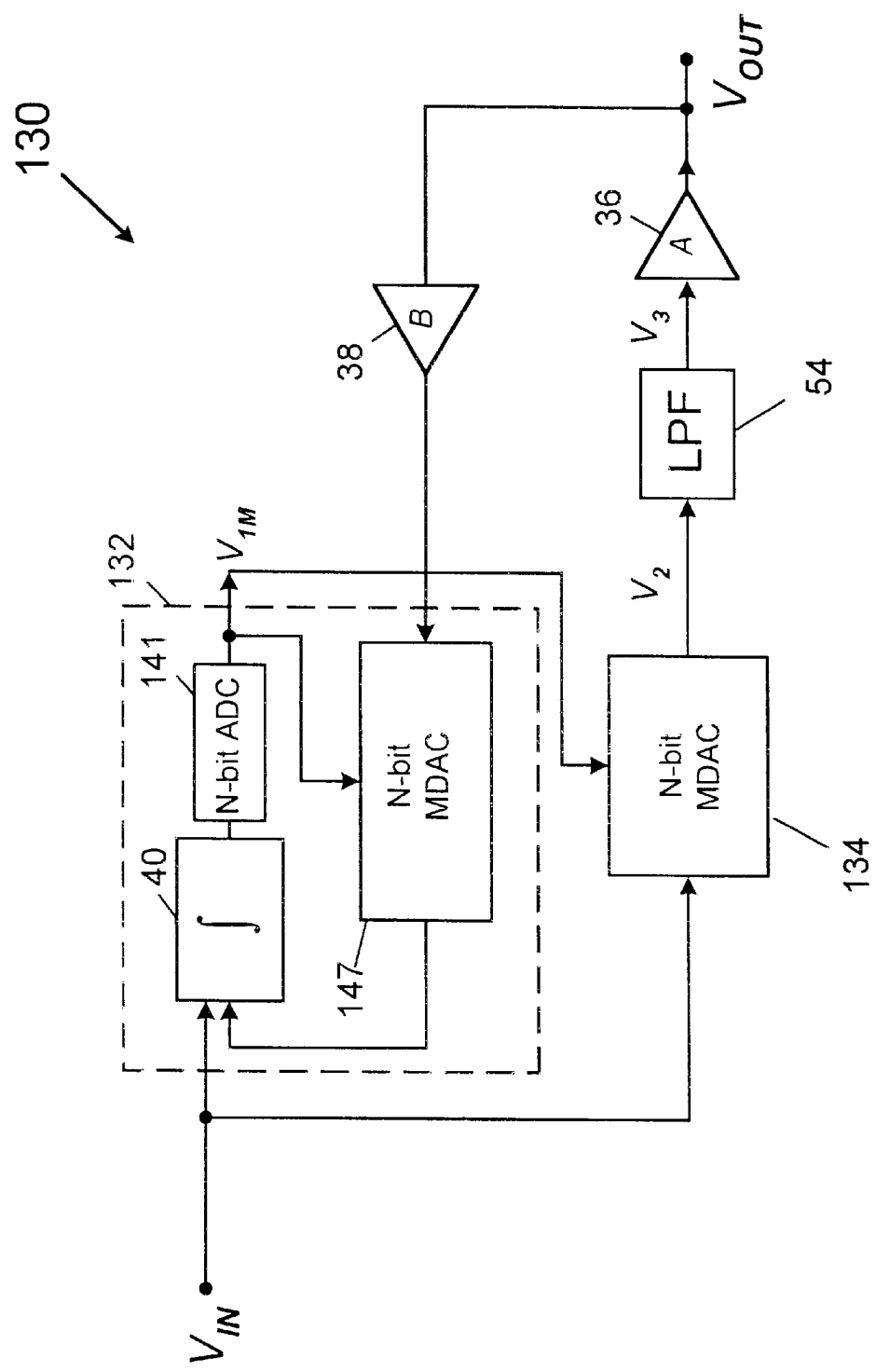
FIG. 3 is another schematic diagram of an RMS-to-DC converter circuit of the present invention.

To obtain lower quantization error, RMS-to-DC converters in accordance with the present invention also may be implemented using multibit stages, as shown in FIG. 3. Circuit 130 includes pulse modulator 132 and demodulator 134. Pulse modulator 132 is an N-bit oversampling Δ-Σ pulse code modulator that includes integrator 40, N-bit ADC 141 and N-bit MDAC 147, and that provides N-bit output $V_{1M}$. Demodulator 134 is an N-bit MDAC. Circuit 30 of FIG. 2 is equivalent to circuit 130 of FIG. 3 with N=1.

The difference between the output of integrator 40 and MDAC 147 equals the quantization error $e_M[i]$ of pulse modulator 132. Multibit implementations such as the circuit shown in FIG. 3 achieve lower quantization error than the single-bit implementation of FIG. 2, but require more complex circuitry.

Figure 4:
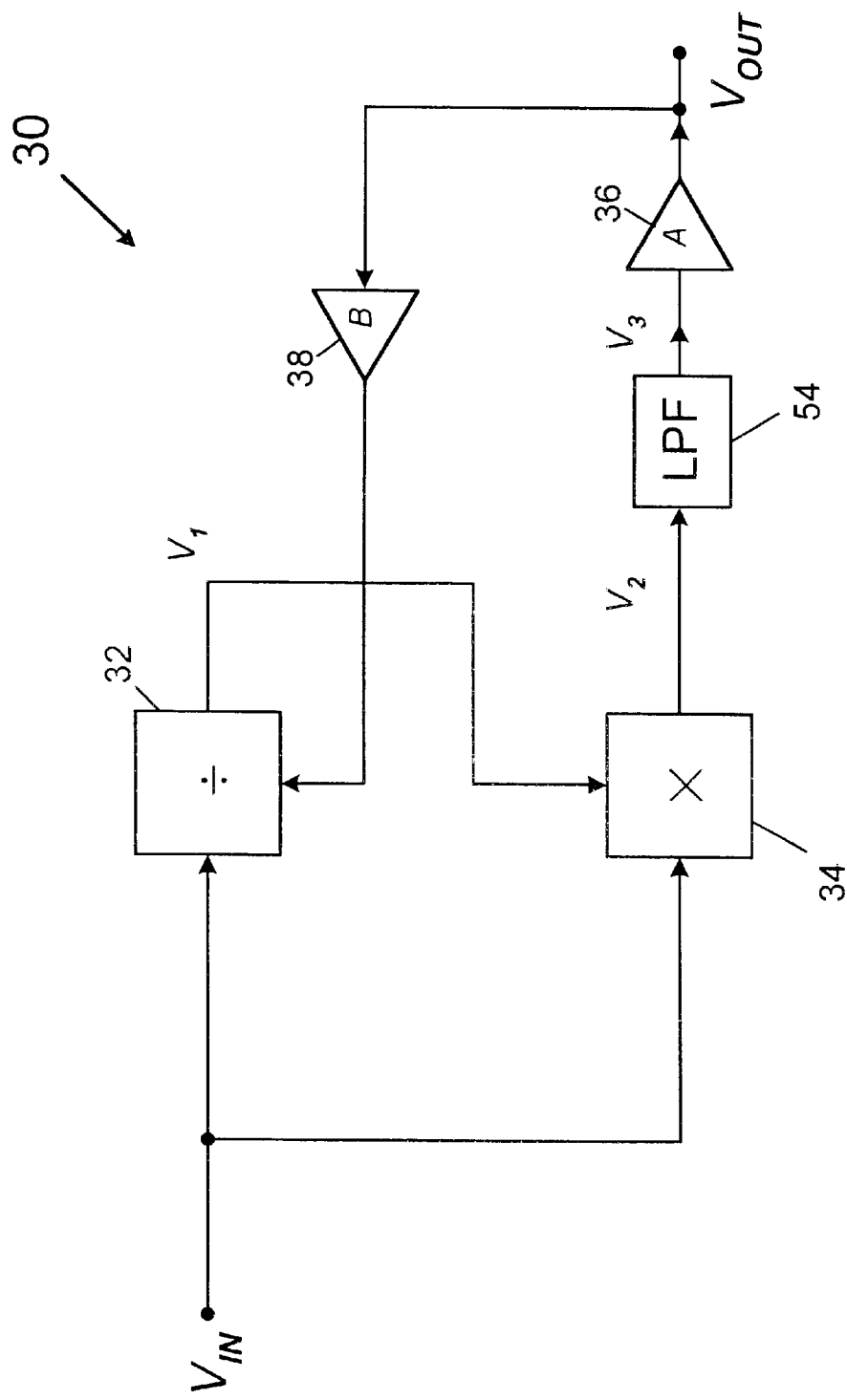
FIG. 4 is a simplified schematic diagram of the RMS-to-DC converter circuit of FIG. 2.
Figure 5:
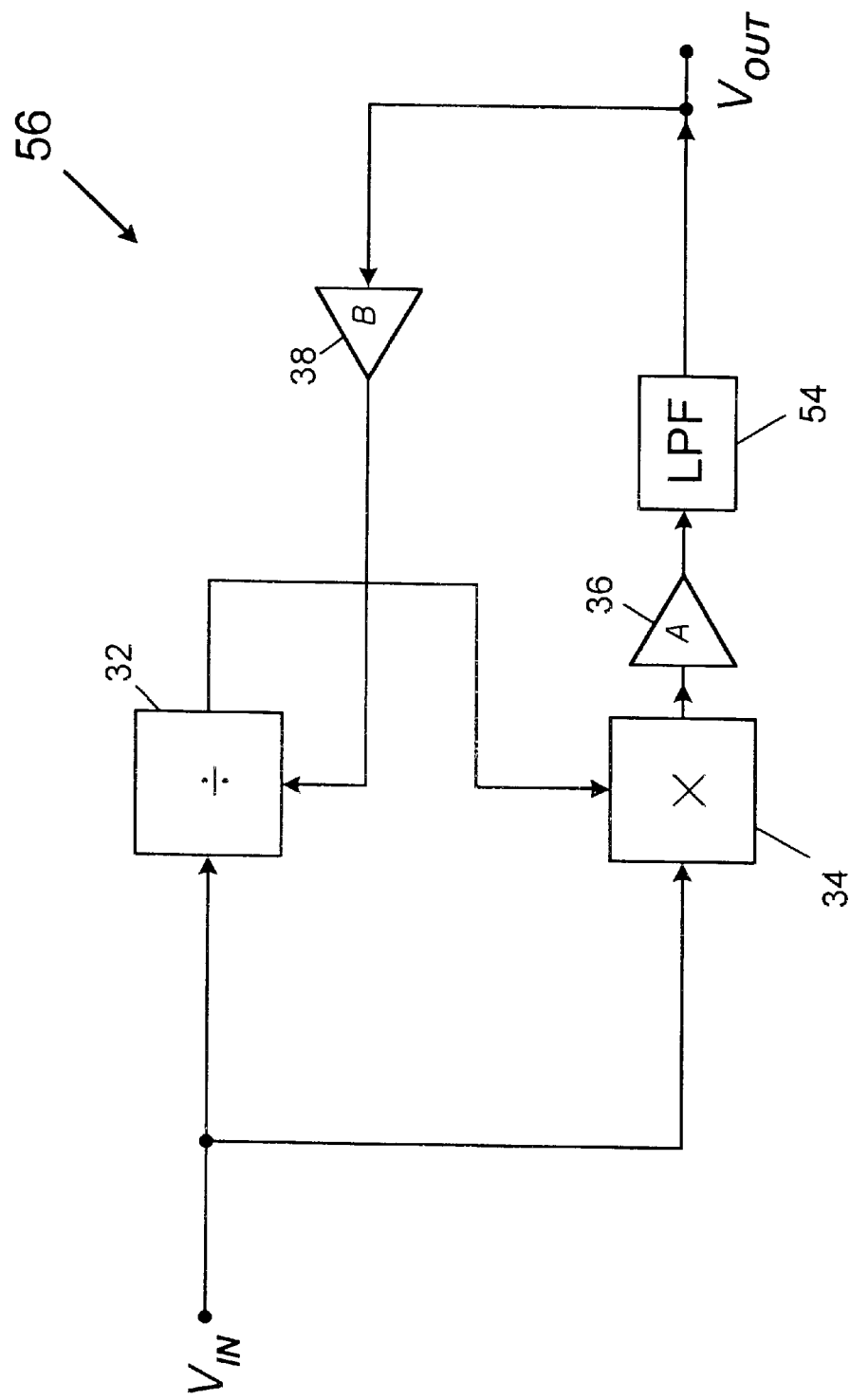
FIG. 5 is an alternative schematic diagram of the RMS-to-DC converter circuit of FIG. 4.
Figure 6:
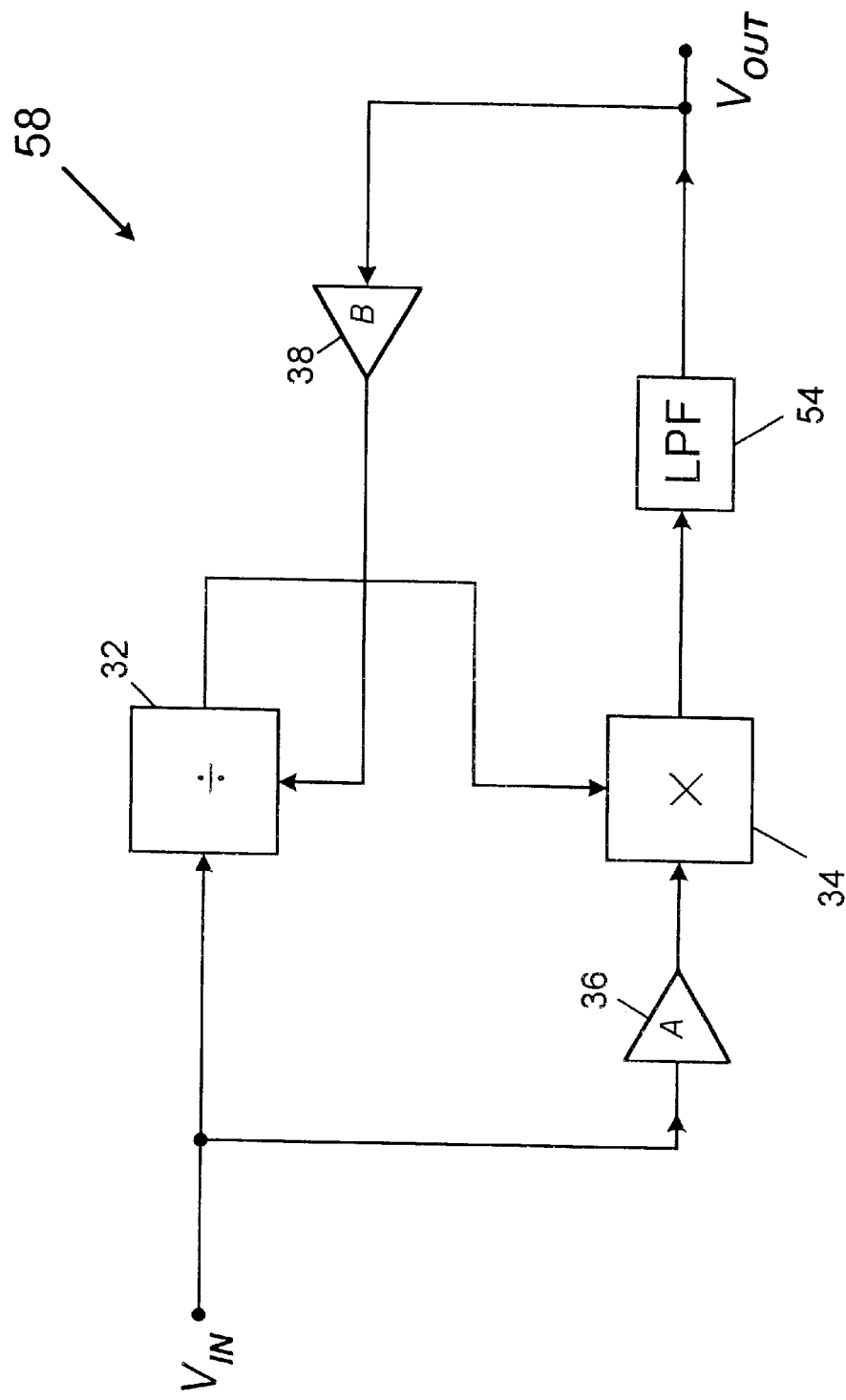
FIG. 6 is another alternative schematic diagram of the RMS-to-DC converter circuit of FIG. 4.

Referring now to FIG. 4, the gain scaling of the RMS-to-DC converter circuit 30 is described. To simplify the analysis, FIG. 4 depicts pulse modulator 32 as an ideal divider circuit and demodulator 34 as an ideal multiplier. $V_{OUT}$ can be written as:

$$V_{OUT} = \sqrt{\frac{A}{B}} \times \sqrt{V_{IN}^2} \quad (16a)$$

$$= \sqrt{\frac{A}{B}} \times V_{RMS} \quad (16b)$$

By setting A=B, the overall gain of circuit 30 substantially equals unity (1.0). Alternatively, the overall gain of circuit 30 may be set substantially equal to another integer value by setting the ratio A/B equal to an integer squared. If circuit 30 is implemented in integrated circuit technology, the ratio of gains A and B may be very closely matched to provide a very accurate overall gain.

Because the maximum duty ratio of $V_1$ cannot exceed 100%, the peak magnitude $V_{PEAK}$ of input signal $V_{IN}$ must satisfy the following relation:

$$V_{PEAK} \leq B \times V_{OUT} \quad (17)$$

Combining equations (16b) and (17), $$V_{PEAK} \leq \sqrt{A \times B} \times V_{RMS} \quad (18)$$

The ratio of the peak-to-RMS value of a time-varying waveform is the crest factor. From equation (18), the crest factor limit for circuit 30 equals:

$$\text{Crest Factor Limit} = \frac{V_{PEAK}}{V_{RMS}} \leq \sqrt{A \times B} \quad (19)$$

Thus, the crest factor limit can be adjusted while maintaining a substantially unity (or other integer-valued) overall gain.

Figure 7:
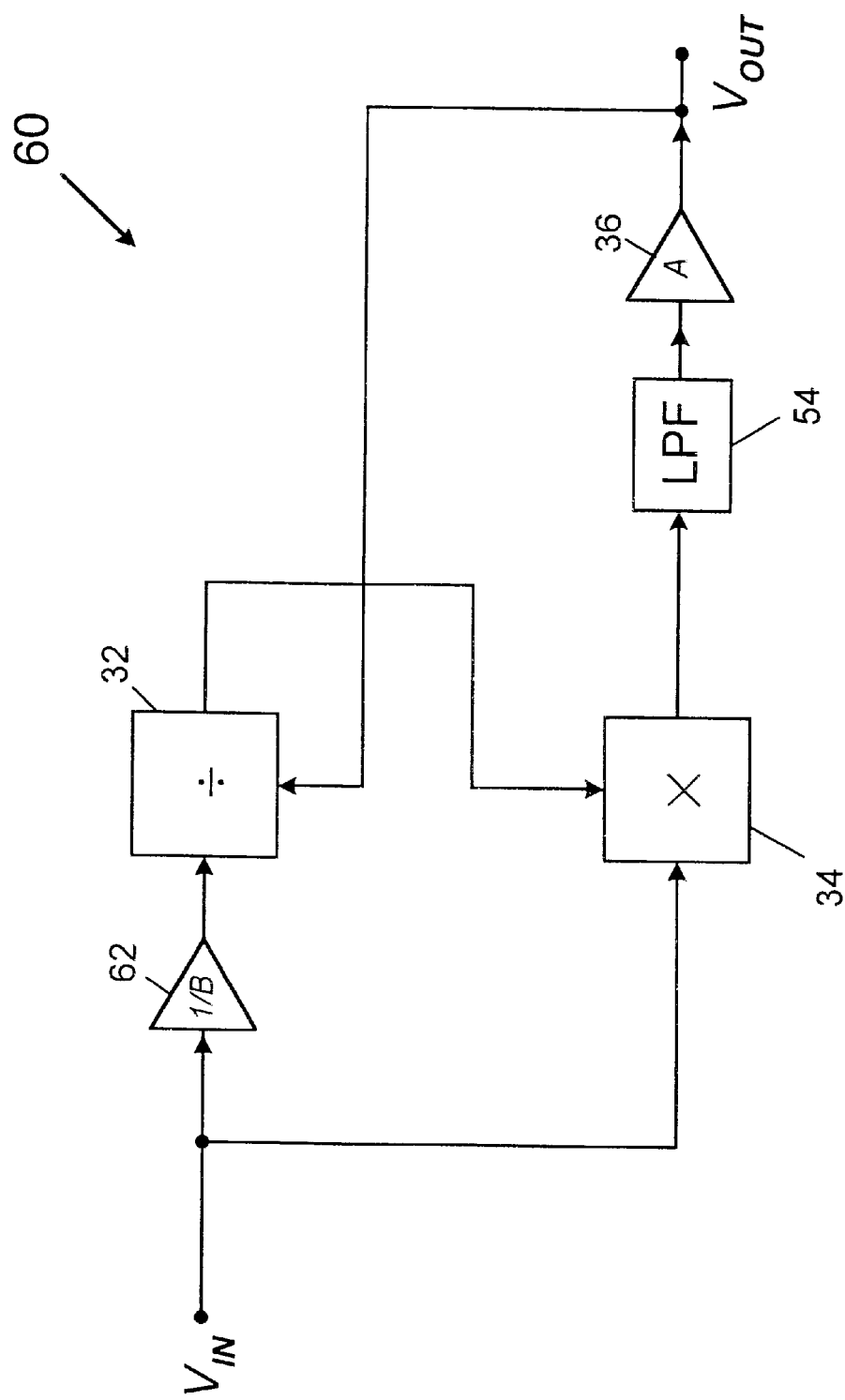
FIG. 7 is another alternative schematic diagram of the RMS-to-DC converter circuit of FIG. 4.
Figure 8:
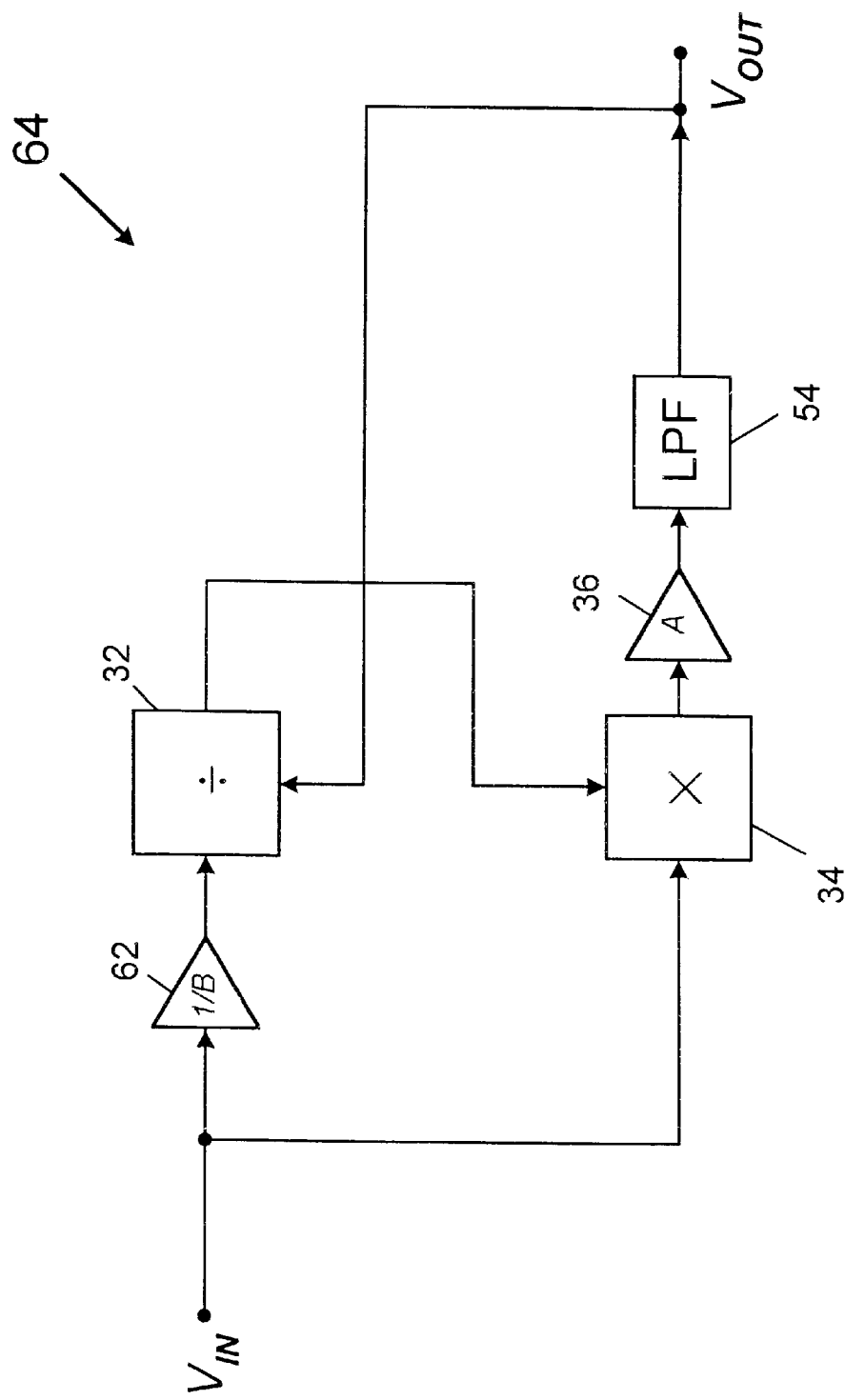
FIG. 8 is another alternative schematic diagram of the RMS-to-DC converter circuit of FIG. 4.
Figure 9:
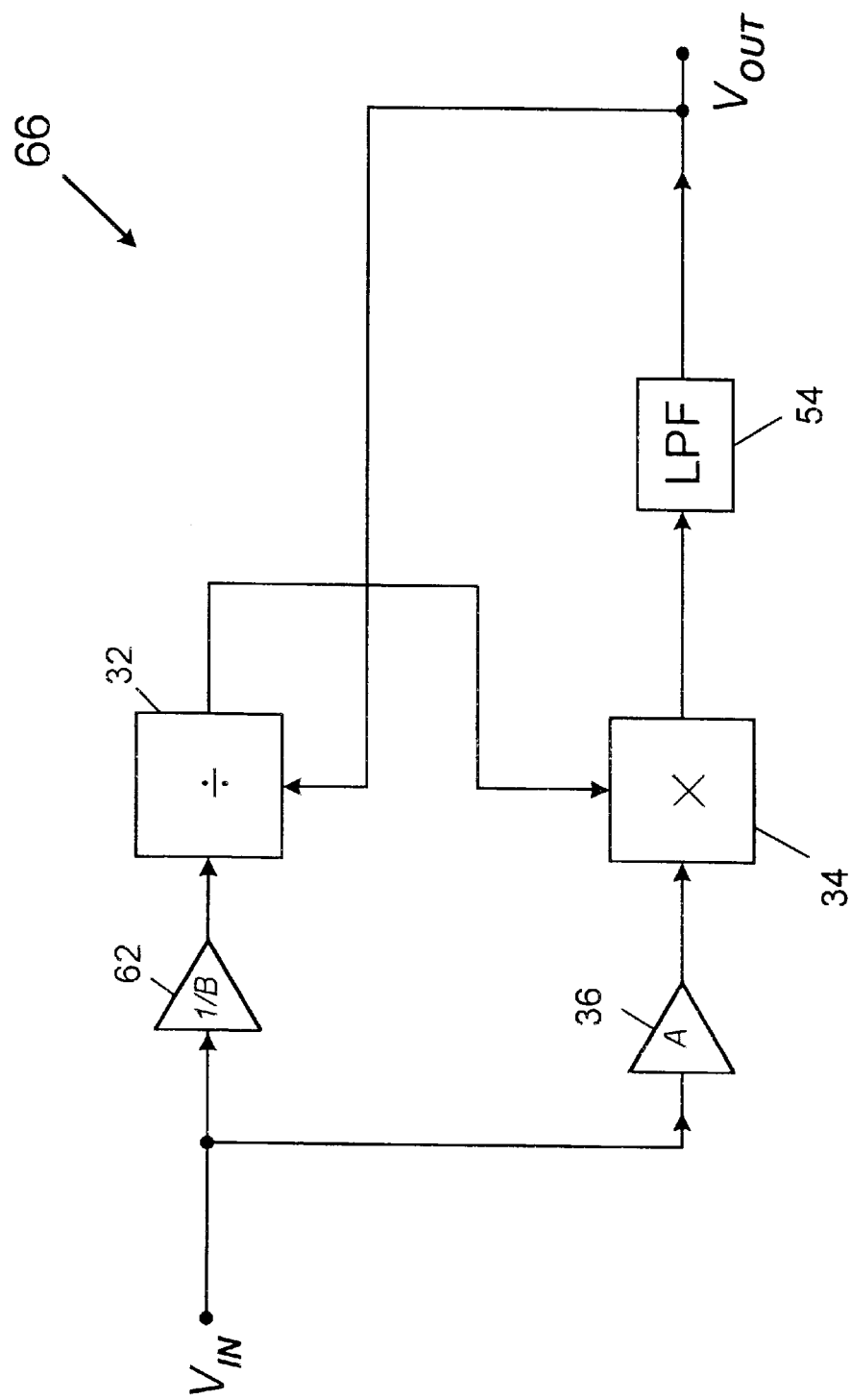
FIG. 9 is another alternative schematic diagram of the RMS-to-DC converter circuit of FIG. 4.

The broadband gain stages may be placed at various locations within RMS-to-DC converters of the present invention. In particular, as shown in FIGS. 4–9, gains stage 36 may be placed in various locations in an input or output signal path of demodulator 34, and gain stage 38 (or gain stage 62) may be placed in various locations in an input signal path of modulator 32. Each of FIGS. 4–9 illustrate circuits that provide an output signal $V_{OUT}$ as described in equation (16b) and have a crest factor limitation as described by equation (19). In FIGS. 7–9, gain stage 62 has a broadband gain 1/B.

In the embodiment shown in FIG. 4, the input signals to gain stages 36 and 38 are quasi-static DC signals. As a result, the gain-bandwidth requirements of amplifier circuits used to implement gain stages 36 and 38 may be relaxed compared to embodiments in which the input signals to the gain stages include higher frequency components. In addition, if gain stages 36 and 38 in FIG. 4 are implemented using switched-capacitor circuits that include auto-zero techniques, gain stages 36 and 38 may achieve very high accuracy.

If pulse modulator 32 is implemented as a Δ-Σ modulator, the ratio of $V_{IN}$ to $V_{OUT}$ preferably should be substantially irrational to minimize limit cycles and idle tones, as described, for example, in Steven R. Norsworthy et al., "Delta-Sigma Data Converters," IEEE Press, pp. 80–104, 1997. Accordingly, gain B (or 1/B) may be set substantially to an irrational number. To maintain an overall gain of substantially unity, gain A should be set substantially equal to B. If circuit 30 is implemented as a single integrated circuit, gains A and B may be set using ratioed circuit elements (e.g., capacitors or resistors) having large-valued prime numbers.

For example, RMS-to-DC converter circuits of this invention may be implemented with switched capacitor techniques on a single integrated circuit, and gain stages 36 and 38 (or 62) each may be implemented using switched-capacitor circuits having gain-setting capacitors whose ratio is 283 to 67 (i.e., a ratio of 4.2239 . . . ). As a result of manufacturing tolerances, the absolute value of each capacitor, and the resulting capacitor ratio, will vary by a sufficiently random amount to minimize limit cycles and idle tones. Nevertheless, with commonly-used integrated circuit layout techniques, the ratio of A and B can be made to match very closely.

Figure 10:
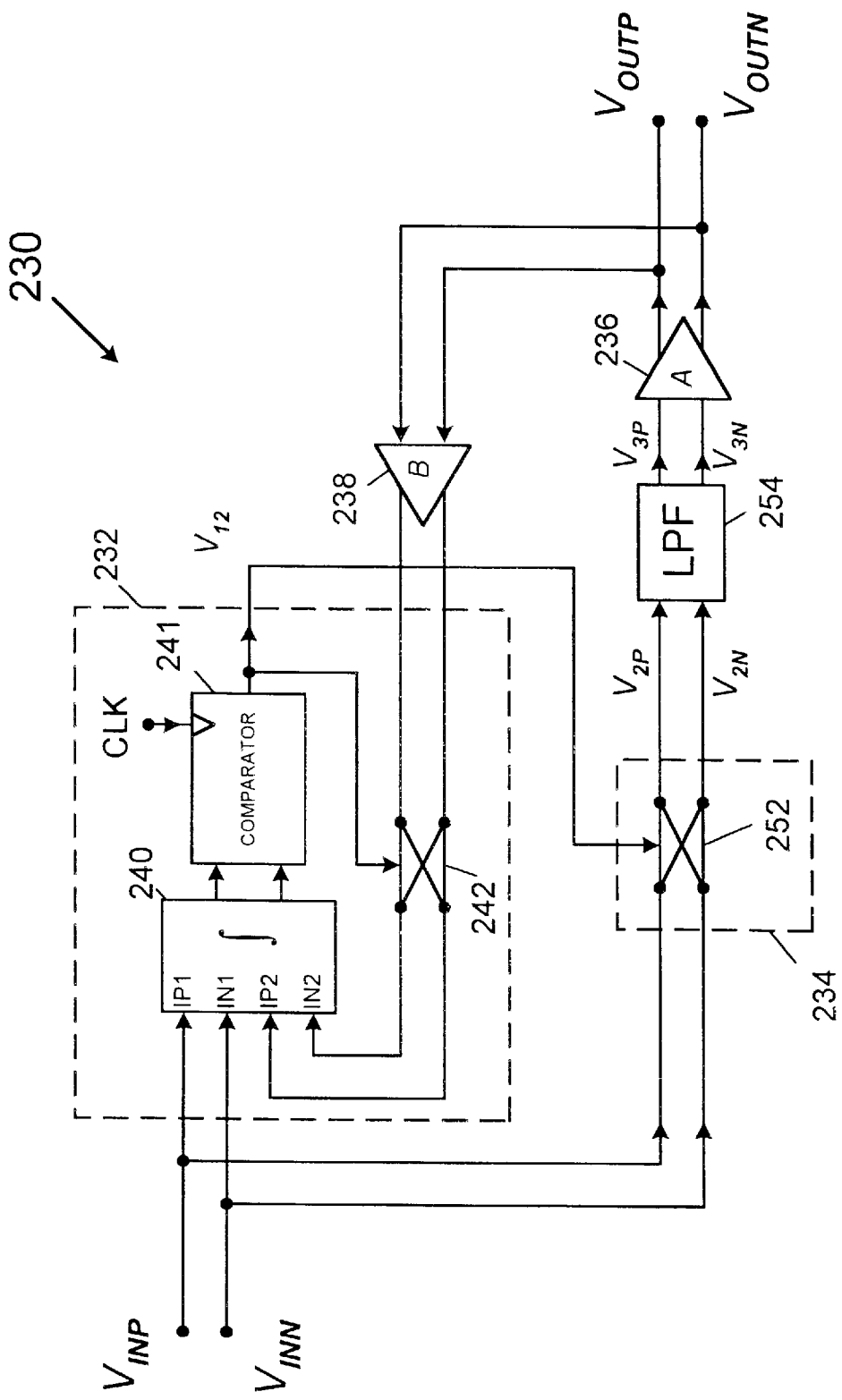
FIG. 10 is a schematic diagram of a differential RMS-to-DC converter circuit of the present invention.

FIG. 10 illustrates a differential embodiment of an RMS-to-DC converter circuit in accordance with the present invention. Circuit 230 includes pulse modulator 232, demodulator 234, gain stage 236, gain stage 238 and low-pass filter 254. Circuit 230 receives differential inputs $V_{INP}$ and $V_{INN}$ and provides differential outputs $V_{OUTP}$ and $V_{OUTN}$.

Pulse modulator 232 may be any commonly known pulse modulator, such as a pulse code modulator, pulse width modulator, or other similar modulator. As shown in FIG. 10, pulse modulator 232 preferably is implemented as a single-bit oversampling Δ-Σ pulse code modulator, and includes integrator 240, comparator 241 and crosspoint switch 242.

Integrator 240 has first differential inputs IP1 and IN2 coupled to inputs $V_{INP}$ and $V_{INN}$, respectively, second differential inputs IP2 and IN2 coupled to differential outputs of crosspoint switch 242, and differential outputs coupled to differential inputs of comparator 241. Comparator 241 has an output $V_{12}$ coupled to control terminals of crosspoint switches 242 and 252. Crosspoint switch 242 has differential inputs coupled to differential outputs of gain stage 238, and differential outputs coupled to second differential inputs IP2 and IN2 of integrator 240. Gain stage 238 has differential inputs coupled to $V_{OUTP}$ and $V_{OUTN}$, and provides broadband gain B.

$V_{12}$ is a signal having a binary output level (e.g., −1 or +1). If $V_{12}$=−1, the differential outputs of gain stage 238 are coupled without inversion to second differential inputs IP2 and IN2 of Δ-Σ stage 240. That is, (assuming gain B=1) $V_{OUTP}$ is coupled to IP2 and $V_{OUTN}$ is coupled to IN2. Alternatively, if $V_{12}$=+1, the differential outputs of gain stage 238 are coupled with inversion to second differential inputs IP2 and IN2 of Δ-Σ stage 240. That is, (assuming gain B=1) $V_{OUTN}$ is coupled to IP2 and $V_{OUTP}$ is coupled to IN2.

Demodulator 234 comprises crosspoint switch 252 having differential inputs coupled to inputs $V_{INP}$ and $V_{INN}$, differential outputs coupled to differential inputs $V_{2P}$ and $V_{2N}$ of lowpass filter 254, and a control terminal coupled to $V_{12}$. Lowpass filter 254 has differential outputs $V_{3P}$ and $V_{3N}$ coupled to differential inputs of gain stage 236. Gain stage 236 has differential outputs $V_{OUTP}$ and $V_{OUTN}$, and provides broadband gain A. If $V_{12}$=+1, differential inputs $V_{INP}$ and $V_{INN}$ are coupled without inversion to differential inputs $V_{2P}$ and $V_{2N}$ of lowpass filter 254. That is, $V_{INP}$ is coupled to $V_{2P}$ and $V_{INN}$ is coupled to $V_{2N}$. Alternatively, if $V_{12}$=−1, differential inputs $V_{INP}$ and $V_{INN}$ are coupled with inversion to differential inputs $V_{2P}$ and $V_{2N}$ of lowpass filter 254. That is, $V_{INN}$ is coupled to $V_{2P}$ and $V_{INP}$ is coupled to $V_{2N}$.

Demodulator 234 provides differential outputs $V_{2P}$ and $V_{2N}$ given by (assuming gain B=1):

$$V_{2P} = V_{2N} = \frac{(V_{INP} - V_{INN})^2}{(V_{OUTP} - V_{OUTN})} \quad (20)$$

Lowpass filter 254 may be a continuous-time or a discrete-time filter, and provides differential outputs $V_{3P}$ and $V_{3N}$ equal to (assuming gain B=1):

$$V_{3P} - V_{3N} = \frac{\overline{(V_{INP} - V_{INN})^2}}{(V_{OUTP} - V_{OUTN})} \quad (21)$$

Gain stage 236 provides an output ($V_{OUTP}$−$V_{OUTN}$) equal to ($V_{3P}$−$V_{3N}$) (assuming gain A=1):

$$(V_{OUTP} - V_{OUTN}) = \frac{\overline{(V_{INP} - V_{INN})^2}}{(V_{OUTP} - V_{OUTN})} \quad (22a)$$

$$= \sqrt{\overline{(V_{INP} - V_{INN})^2}} \quad (22b)$$

Thus, circuit 230 provides a differential output ($V_{OUTP}$−$V_{OUTN}$) equal to the RMS value of differential input ($V_{INP}$−$V_{INN}$). As with single-ended circuit 30, gain stages 236 and 238 may be placed at various locations within differential circuit 230 with equivalent results and crest factor limitations. In addition, lowpass filter 254 and/or gain stage 236 may have differential inputs and provide a single-ended output. In such an embodiment, output $V_{OUTN}$ is tied to a reference (e.g., GROUND).

Modulators 32, 132, and 232 of FIGS. 2–10 may introduce delay between modulator output $V_1$ (or $V_{1M}$ or $V_{12}$) and input $V_{IN}$ (or $V_{INP}$ and $V_{INN}$). This delay may affect the accuracy of output $V_2$ (or $V_{2P}$ and $V_{2N}$) of demodulators 34 (or 134 or 234). For example, referring again to circuit 30 of FIG. 4, output $V_2$ of demodulator 34 may be expressed as:

$$V_2(t) = V_{IN}(t) \times \frac{V_{IN}(t - \tau)}{B \times V_{OUT}} \quad (23)$$

where t represents time (continuous or discrete) and τ is any delay introduced by modulator 32 (because $V_{OUT}$ is quasi-static, it has not been expressed in equation (23) as a function of time t). For non-zero values of τ, $V_{OUT}$ has a bandwidth roll-off that may be undesirable for certain input signals.

Figure 11:
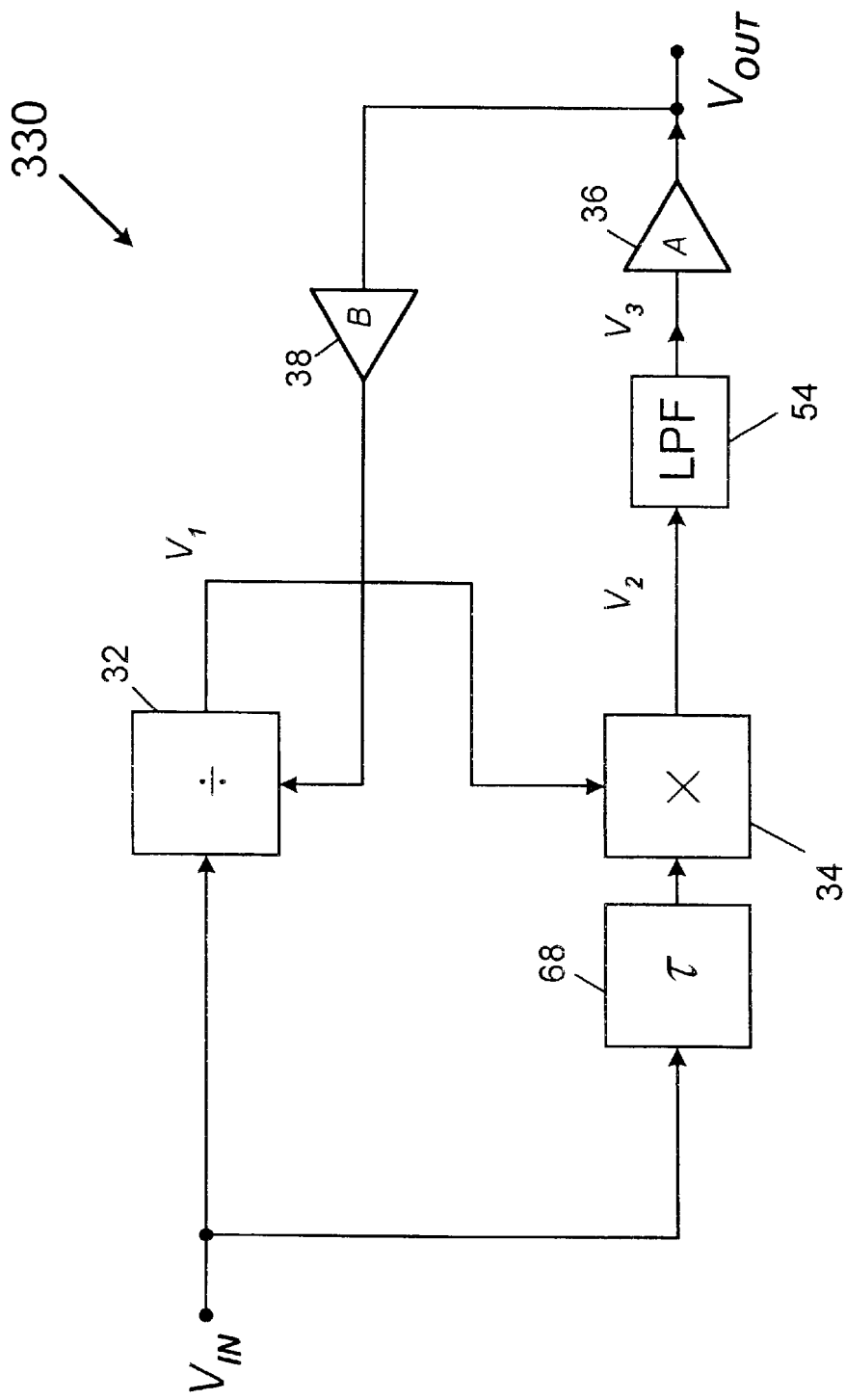
FIG. 11 is a schematic diagram of a matched-delay RMS-to-DC converter circuit of the present invention.

To minimize the bandwidth rolloff effect, a delay stage can be introduced in the signal path between input $V_{IN}$ and demodulator 34 that has a delay that substantially equals the delay through modulator 32. As shown in FIG. 11, circuit 330 includes the same circuit blocks as circuit 30, but also includes delay stage 68 that introduces a delay τ that substantially equals the delay introduced by modulator 32. For example, if pulse modulator 32 is implemented as a Δ-Σ converter, delay stage 68 may be implemented as a switched-capacitor delay stage whose delay substantially equals the delay through modulator 32. If modulator 32 is a first-order Δ-Σ converter, the delay in delay stage 68 equals a single clock period.

The output of a pulse code modulator includes the desired PCM output, plus an error term commonly called quantization noise. For Δ-Σ modulators, various techniques have been used to minimize the effect of quantization noise, including using second, third, and higher-order modulator loops that provide additional noise shaping and improved performance. RMS-to-DC converter circuits in accordance with the present invention may include such high-order Δ-Σ modulators.

Higher-order loops, however, also require frequency compensation, which causes undesirable frequency-dependent delay that is difficult to compensate using a stage such as delay stage 68. Additionally, higher-order loops have input signal range restrictions that may further limit the usefulness of the Δ-Σ modulator in an RMS-to-DC converter.

As an alternative to using higher-order modulator loops to improve modulator performance, circuits in accordance with the present invention instead may use cascaded Δ-Σ modulators. In particular, two Δ-Σ modulators may be used, in which the second modulator digitizes a measure of the quantization error of the first modulator. The output of the two modulators then can be combined to cancel the quantization noise of the first modulator. Such cascaded modulators ideally provide the performance of higher-order loops, but use simple Δ-Σ stages that are easy to compensate.

Figure 12:
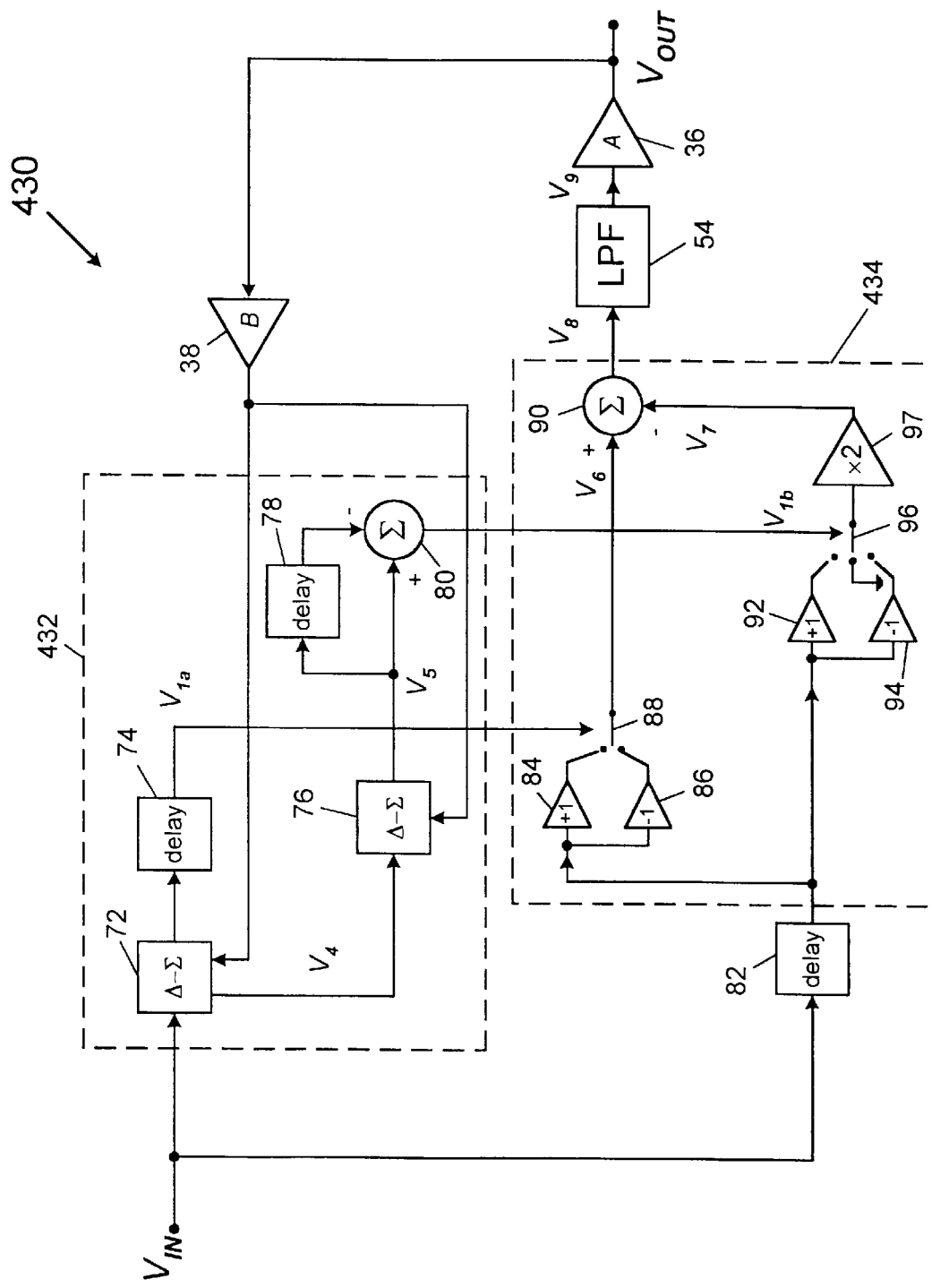
FIG. 12 is a schematic diagram of an RMS-to-DC converter circuit of the present invention including cascaded Δ-Σ modulators.

FIG. 12 illustrates an embodiment of RMS-to-DC converters of the present invention that includes cascaded Δ-Σ modulators. Circuit 430 includes pulse modulator 432, demodulator 434, gain stage 36, gain stage 38, lowpass filter 54 and optional delay-matching stage 82. To simplify the description of modulator 432 and demodulator 434, the following discussion assumes that A=B=1. This assumption only affects a scale factor in the resulting analysis.

Pulse modulator 432 includes cascaded Δ-Σ pulse code modulators. In particular, pulse modulator 432 includes Δ-Σ stages 72 and 76, delay stages 74 and 78 and subtractor 80. As described in more detail below, Δ-Σ stage 76, delay stage 78 and subtractor 80 provide an estimate of the spectrally-shaped quantization error of Δ-Σ stage 72.

Δ-Σ stage 72 has a first input coupled to $V_{IN}$, a second input coupled to the output of gain stage 38, a first output coupled to the input of delay stage 74, and a second output $V_4$ coupled to a first input of Δ-Σ stage 76. Δ-Σ stage 76 has a second input coupled to the output of gain stage 38, and an output $V_5$ coupled to a non-inverting input of subtractor 80 and to an input of delay stage 78. Subtractor 80 has an inverting input coupled to an output of delay stage 78, and an output $V_{1b}$ coupled to a control terminal of switch 96. Delay stage 74 matches the delay through Δ-Σ stage 76, and has an output $V_{1a}$ coupled to a control terminal of switch 88.

Δ-Σ stages 72 and 76 each are, for example, single-bit modulators that can be of any order. Preferably, Δ-Σ stage 72 is a first-order stage. First-order Δ-Σ stage 72 and delay stage 74 provide output $V_{1a}$ equal to (assuming gain B=1):

$$V_{1a}[i+1] = \frac{(V_{IN}[i-1])}{V_{OUT}} + \frac{(e[i] - e[i-1])}{V_{OUT}} \quad (24)$$

where index i denotes the sample index and e[i] is the quantization error of Δ-Σ stage 72. $V_{1a}$ thus equals the desired ratio of the input divided by $V_{OUT}$, plus the spectrally-shaped quantization error of Δ-Σ stage 72 divided by $V_{OUT}$.

Δ-Σ stage 76, delay stage 78 and subtractor 80 provide an output $V_{1b}$ equal to an estimate of the spectrally-shaped quantization error of Δ-Σstage 72 divided by $V_{OUT}$. In particular, $V_4$ is the quantization error e[i] of Δ-Σ stage 72, which equals the difference between the integrator and MDAC outputs of Δ-Σ stage 72. Δ-Σ stage 76 provides an output $V_5$ equal to (assuming gain B=1):

$$V_5[i+1] = \left(\frac{1}{V_{OUT}}\right) \times [e[i] + (e'[i+1] - e'[i])] \quad (25)$$

where e'[i] is the quantization error of Δ-Σ stage 76. Delay stage 78 and subtractor 80 form a digital differentiator that provide an output $V_{1b}$ equal to (assuming gain B=1):

$$V_{1b}[i+1] = \left(\frac{1}{V_{OUT}}\right) \times [e_1 + e_2] \quad (26)$$

where $$e_1 = e[i] - e[i-1] \quad (27a)$$

$$e_2 = e'[i+1] - 2e'[i] + e'[i-1] \quad (27b)$$

Delay stage 82 matches the combined delay through Δ-Σ modulators 72 and 76. Demodulator 434 provides an output proportional to input $V_{IN}$ times the ratio of $V_{IN}$ to $V_{OUT}$. In particular, demodulator 434 includes non-inverting buffer 84, inverting buffer 86, switch 88, subtractor 90, non-inverting buffer 92, inverting buffer 94, three-position switch 96 and multiply-by-two stage 97. Non-inverting buffer 84 provides unity gain (i.e., +1.0) and has an input coupled through delay stage 82 to input $V_{IN}$, and an output coupled to the first terminal of switch 88. Inverting buffer 86 provides inverting gain (i.e., −1.0) and has an input coupled through delay stage 82 to input $V_{IN}$, and an output coupled to the second terminal of switch 88. Non-inverting buffer 84, inverting buffer 86 and switch 88 form a single-bit MDAC. $V_{1a}$ is a binary signal having a binary output level (e.g., −1 or +1). If $V_{1a}$=+1, the pole of switch 88 is coupled to the output of non-inverting buffer 84. That is, +$V_{IN}$ is coupled to first input $V_6$ of subtractor 90. Alternatively, if $V_{1a}$=−1, the pole of switch 88 is coupled to the output of inverting buffer 86. That is, −$V_{IN}$ is coupled to first input $V_6$ of subtractor 90. $V_6$ equals (assuming gain B=1):

$$V_6[i+1] = \frac{V_{IN}[i-1]}{V_{OUT}} \times V_{1a}[i+1] \quad (28a)$$

$$= \frac{V_{IN}[i-1]}{V_{OUT}} \times (V_{IN}[i-1] + e_1) \quad (28b)$$

Non-inverting buffer 92 provides unity gain (i.e., +1.0) and has an input coupled through delay stage 82 to input $V_{IN}$, and an output coupled to the first terminal of three-position switch 96. Inverting buffer 86 provides inverting gain (i.e., −1.0) and has an input coupled through delay stage 82 to input $V_{IN}$, and an output coupled to the third terminal of three-position switch 96. The second terminal of three-position switch 96 is coupled to GROUND. Non-inverting buffer 92, inverting buffer 94 and three-position switch 96 form a 1.5-bit MDAC. Multiply-by-two stage 97 provides a gain of +2.0.

$V_{1b}$ is a tri-level signal having output values of −2, 0 or +2. If $V_{1b}$=+2, the pole of three-position switch 96 is coupled to the output of non-inverting buffer 92. That is, +2$V_{IN}$ is coupled to second input $V_7$ of subtractor 90. If $V_{1b}$=0, the pole of switch 96 is coupled to GROUND, and therefore 0 is coupled to second input $V_7$ of subtractor 90. If, however, $V_{1b}$=−2, the pole of switch 96 is coupled to the output of inverting buffer 94. That is, −2$V_{IN}$ is coupled to second input $V_7$ of subtractor 90. $V_7$ equals (assuming gain B=1):

$$V_7[i+1] = \frac{V_{IN}[i-1]}{V_{OUT}} \times (e_1 + e_2) \quad (29)$$

Subtractor 90 provides an output $V_8$ that equals the difference between $V_6$ and $V_7$:

$$V_8[i+1] = V_6[i+1] - V_7[i+1] \quad (30a)$$

$$= \frac{V_{IN}[i-1]^2}{V_{OUT}} - \frac{V_{IN}}{V_{OUT}} \times e_2 \quad (30b)$$

Thus, $V_8$ is proportional to $V_{IN}$ squared divided by $V_{OUT}$, substantially without the quantization noise of Δ-Σ stage 72. The quantization noise $e_2$ of Δ-Σ stage 76 remains, but the low frequency portion of that noise is further reduced by the spectral shaping provided by delay 78 and subtractor 80. Further, because $e_2$ is uncorrelated with $V_{IN}$, the DC average of the product of $e_2$ and $V_{IN}$ equals zero. As a result, output $V_9$ of lowpass filter 54 approximately equals:

$$V_9 \approx \sqrt{V_{IN}^2} \quad (31)$$

Output $V_{OUT}$ of gain stage 36 approximately equals (assuming gain A=1):

$$V_{OUT} \approx \sqrt{V_{IN}^2} \quad (32)$$

The circuit of FIG. 12 may be implemented using single-ended or differential circuitry.

Figure 13:
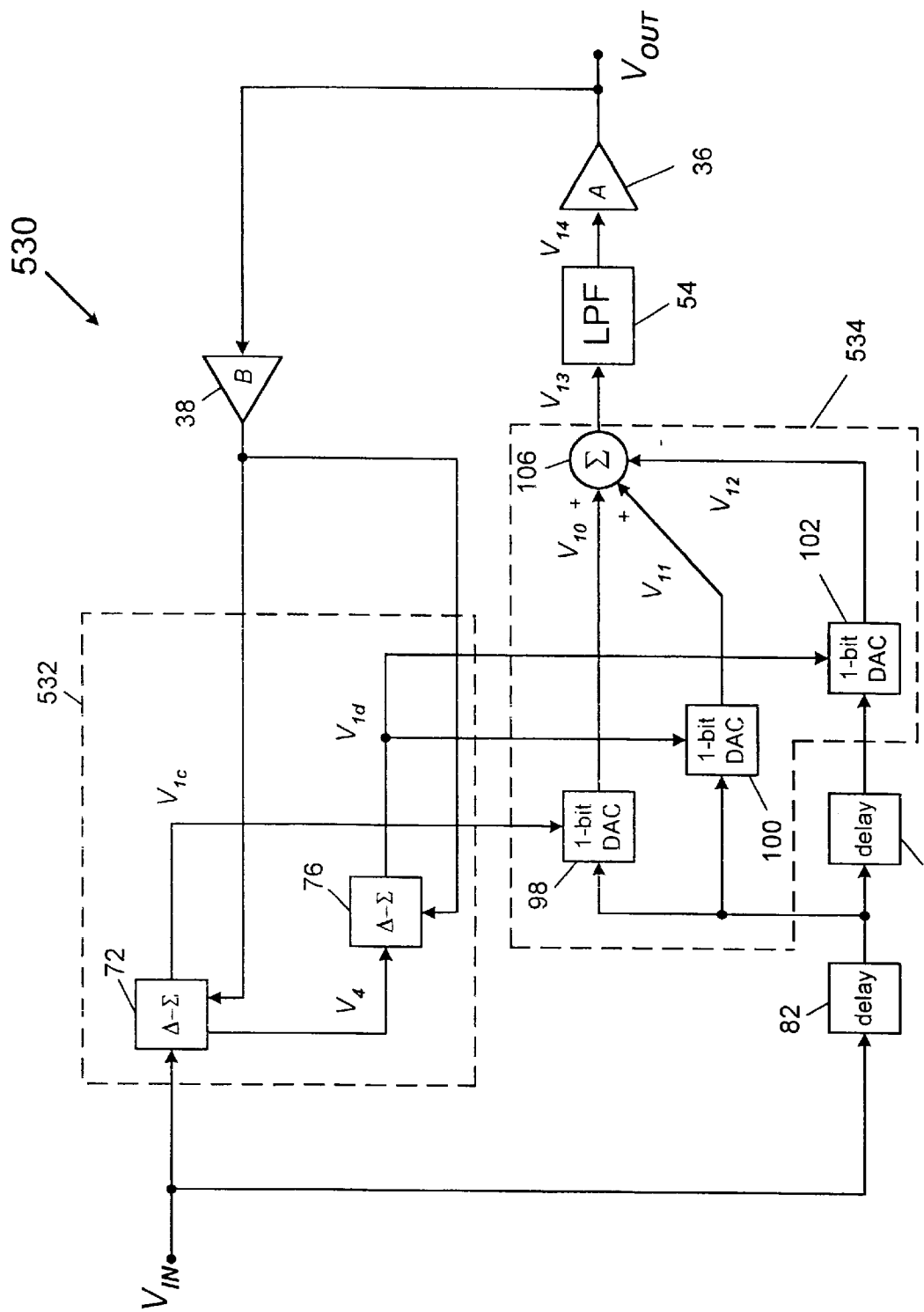
FIG. 13 is another schematic diagram of an RMS-to-DC converter circuit of the present invention including cascaded Δ-Σ modulators.

FIG. 13 shows another illustrative embodiment of RMS-to-DC converters of the present invention that include cascaded Δ-Σ modulators. Converter 530 includes single-sample delay stages 82 and 104, modulator 532 and demodulator 534. Modulator 532 includes single-bit Δ-Σ stages 72 and 76, and demodulator 534 includes single-bit MDAC stages 98, 100 and 102, and adder/subtractor 106. MDACS 98, 100 and 102 may be implemented as in demodulator 34 of FIG. 2 or demodulator 234 of FIG. 10.

Alternatively, one or more of MDACS 98, 100 and 102 may be implemented as a single time-multiplexed MDAC.

Δ-Σ stage 72 provides a quantized output $V_{1c}$ equal to (assuming gain B=1):

$$V_{1c}[i] = \frac{V_{IN}[i-1] + e[i] - e[i-1]}{V_{OUT}} \tag{33}$$

In addition, $V_4$ equals the quantization error e[i] of Δ-Σ stage 72.

Δ-Σ stage 76 provides a quantized output $V_{1d}$ equal to (assuming gain B=1):

$$V_{1d}[i] = \frac{e[i-1] + e'[i] - e'[i-1]}{V_{OUT}} \tag{34}$$

Single-bit DACs 98, 100 and 102 provide outputs $V_{10}$, $V_{11}$ and $V_{12}$, respectively, equal to (assuming gain B=1):

$$V_{10}[i] = V_{IN}[i-1] \times V_{1c}[i] \tag{35}$$

$$V_{11}[i] = V_{IN}[i-1] \times V_{1d}[i] \tag{36}$$

$$V_{12}[i] = V_{IN}[i-2] \times V_{1d}[i] \tag{37}$$

Adder/subtractor 106 provides an output $V_{13}$ equal to:

$$V_{13}[i] = V_{10}[i] + V_{11}[i] - V_{12}[i] \tag{38}$$

which equals (assuming gain B=1):

$$V_{13}[i] = \frac{V_{IN}[i-1]}{V_{OUT}} \times (V_{IN}[i-1] + e[i] + e'[i] - e'[i-1]) - \frac{V_{IN}[i-2]}{V_{OUT}} \times (e[i-1] + e'[i] - e'[i-1]) \tag{39}$$

Note that:

$$V_{13}[i+1] = \frac{V_{IN}[i]}{V_{OUT}} \times (V_{IN}[i] + e[i+1] + e'[i+1] - e'[i]) - \frac{V_{IN}[i-1]}{V_{OUT}} \times (e[i] + e'[i+1] - e'[i]) \tag{40}$$

If the time constant of lowpass filter 54 is much greater than the sample period of $V_{13}[i]$ (e.g., 10,000 times), lowpass filter 54 provides output $V_{14}$ that is the average of sequence $V_{13}$. $V_{13}$ as a function of $V_{IN}[i-1]$ approximately equals:

$$V_{13} \mid V_{IN}[i-1] \approx \tag{41}$$
$$\frac{V_{IN}[i-1]}{V_{OUT}} \times (V_{IN}[i-1] + e[i] + e'[i] - e'[i-1]) -$$
$$\frac{V_{IN}[i-1]}{V_{OUT}} \times (e[i] + e'[i+1] - e'[i])$$

which may be written as:

$$V_{13} \mid V_{IN}[i-1] = \left(\frac{V_{IN}[i-1]}{V_{OUT}}\right)^2 - \tag{42}$$
$$\frac{V_{IN}[i-1] \times (e'[i+1] - 2e'[i] + e'[i-1])}{V_{OUT}}$$

The first term on the right side of equation (42) is the desired output, and the second term equals the second-order spectrally-shaped quantization noise of Δ-Σ stage 76, which is substantially reduced by lowpass filter 54. Further, because e' is uncorrelated with $V_{IN}$, the DC average of the product of e' and $V_{IN}$ equals zero. As a result, $V_{14}$ approximately equals:

$$V_{14} = \overline{V_{13}} \approx \frac{\overline{V_{IN}^2}}{V_{OUT}} \tag{43}$$

Output $V_{OUT}$ of gain stage 36 approximately equals (assuming gain A=1):

$$V_{OUT} \approx \sqrt{\overline{V_{IN}^2}} \tag{44}$$

The circuit of FIG. 13 may be implemented using single-ended or differential circuitry.

Figure 14:
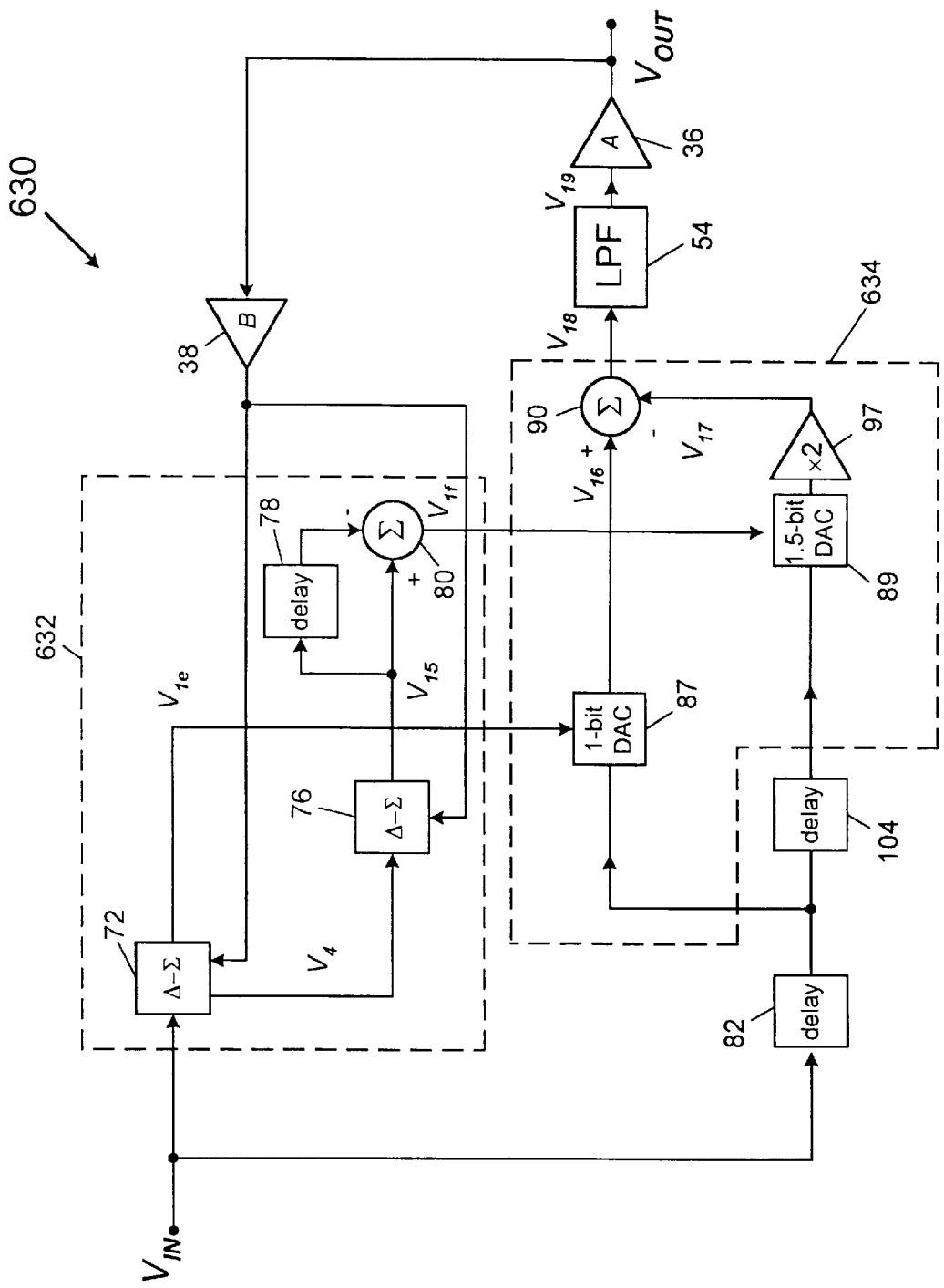
FIG. 14 is another schematic diagram of an RMS-to-DC converter circuit of the present invention including cascaded Δ-Σ modulators.

FIG. 14 illustrates another embodiment of RMS-to-DC converters of the present invention that include cascaded Δ-Σ modulators. Circuit 630 includes delay stages 82 and 104 and pulse modulator 632 and demodulator 634. Circuit 630 includes features of circuits 430 and 530, but substantially eliminates the effect of any DC offset that occurs in Δ-Σ stage 76 and delay stage 104.

Modulator 632 includes single-bit Δ-Σ stages 72 and 76, delay stage 78 and subtractor 80. Demodulator 634 includes 1-bit DAC 87, 1.5-bit DAC 89, subtractor 90 and multiply-by-two stage 97. Delay stage 82 matches the delay through Δ-Σ modulator 72 and delay stage 104 matches the delay through Δ-Σ modulator 76.

Δ-Σ stage 72 provides a quantized output $V_{1e}$ equal to (assuming gain B=1):

$$V_{1e}[i] = \frac{V_{IN}[i-1] + e[i] - e[i-1]}{V_{OUT}} \tag{45}$$

Δ-Σ stage 76, delay stage 78 and subtractor 80 provide an output $V_{1f}$ equal to an estimate of the spectrally-shaped quantization error $V_4$ of Δ-Σ stage 72 divided by $V_{OUT}$. Δ-Σ stage 76 provides an output $V_{15}$ equal to (assuming gain B=1):

$$V_{15}[i+1] = \left(\frac{1}{V_{OUT}}\right) \times [e[i] + (e'[i+1] - e'[i])] \tag{46}$$

where e'[i] is the quantization error of Δ-Σ stage 76. Delay stage 78 and subtractor 80 form a digital differentiator that provide an output $V_{1f}$ equal to (assuming gain B=1):

$$V_{1f}[i+1] = \left(\frac{1}{V_{OUT}}\right) \times [e_1 + e_2] \tag{47}$$

where $$e_1 = e[i] - e[i-1] \tag{48a}$$

$$e_2 = e'[i+1] - 2e'[i] + e'[i-1] \tag{48b}$$

$V_{16}$ equals (assuming gain B=1):

$$V_{16}[i] = \frac{V_{IN}[i-1]}{V_{OUT}} \times V_{1e}[i] \tag{49a}$$

$$= \frac{V_{IN}[i-1]}{V_{OUT}} \times (V_{IN}[i-1] + e_1) \tag{49b}$$

$V_{17}$ equals (assuming gain B=1):

$$V_{17}[i+1] = \frac{V_{IN}[i-1]}{V_{OUT}} \times (e_1 + e_2) \quad (50)$$

The digital differentiator formed by delay stage 78 and subtractor 80 has a zero at DC, and therefore sequence $V_{1f}$ substantially has no DC component. As a result, sequence $V_{17}$ is substantially free of any DC offset introduced by delay stages 82 and 104, and Δ-Σ stage 76.

Subtractor 90 provides an output $V_{18}$ that equals the difference between V16 and $V_{17}$:

$$V_{18}[i+1] = V_{16}[i] - V_{17}[i+1] \quad (51a)$$

$$= \frac{V_{IN}[i-1]^2}{V_{OUT}} - \frac{V_{IN}}{V_{OUT}} \times e_2 \quad (51b)$$

Thus, $V_{18}$ is proportional to $V_{IN}$ squared divided by $V_{OUT}$, substantially without the quantization noise of Δ-Σ stage 72. Output $V_{19}$ of lowpass filter 54 approximately equals:

$$V_{19} \approx \sqrt{V_{IN}^2} \quad (52)$$

and output $V_{OUT}$ of gain stage 36 approximately equals (assuming gain A=1):

$$V_{OUT} \approx \sqrt{V_{IN}^2} \quad (53)$$

The circuit of FIG. 14 may be implemented using single-ended or differential circuitry.

Figure 15:
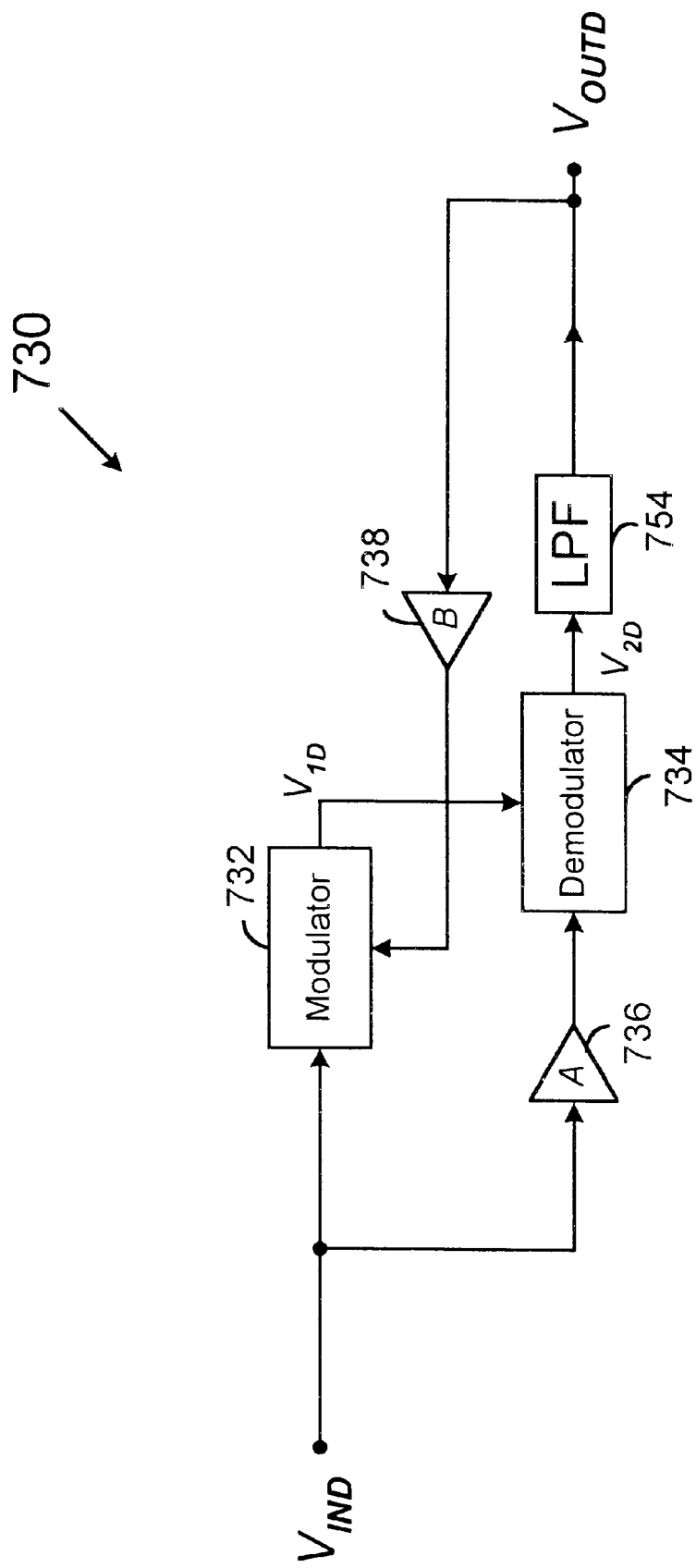
FIG. 15 is a schematic diagram of an RMS-to-DC converter circuit of the present invention using digital circuitry.

In addition to continuous-time and sampled-data implementations, RMS-to-DC converters in accordance with the present invention also may be implemented using digital signal processing techniques. Such implementations may be advantageous, for example, if the signal to be converted is available as a digital signal (e.g., following analog-to-digital conversion). FIG. 15 illustrates an exemplary digital circuit embodiment of RMS-to-DC converters in accordance with this invention.

Circuit 730 includes digital pulse modulator 732, digital demodulator 734, digital gain stages 736 and 738 and digital lowpass filter 754. Circuit 730 provides output signal $V_{OUTD}$ that is a digital number proportional to the RMS value of an input signal represented by the sequence of digital numbers $V_{IND}$. $V_{IND}$, for example, may be a multi-bit digital signal, such as a 10-bit digital signal (9 magnitude bits plus 1 sign bit).

Digital pulse modulator 732 has a first input coupled to $V_{IND}$, a second input coupled to the output of digital gain stage 738 and an output $V_{1D}$. Digital gain stage 738 has an input coupled to $V_{OUTD}$, and provides broadband gain B. Digital gain stage 736 has an input coupled to $V_{IND}$, and provides broadband gain A. Digital demodulator 734 has an input coupled to the output of digital gain stage 736, a control input coupled to $V_{1D}$ and an output $V_{2D}$. Digital lowpass filter 754 has an input coupled to $V_{2D}$ and provides output $V_{OUTD}$.

Figure 16:
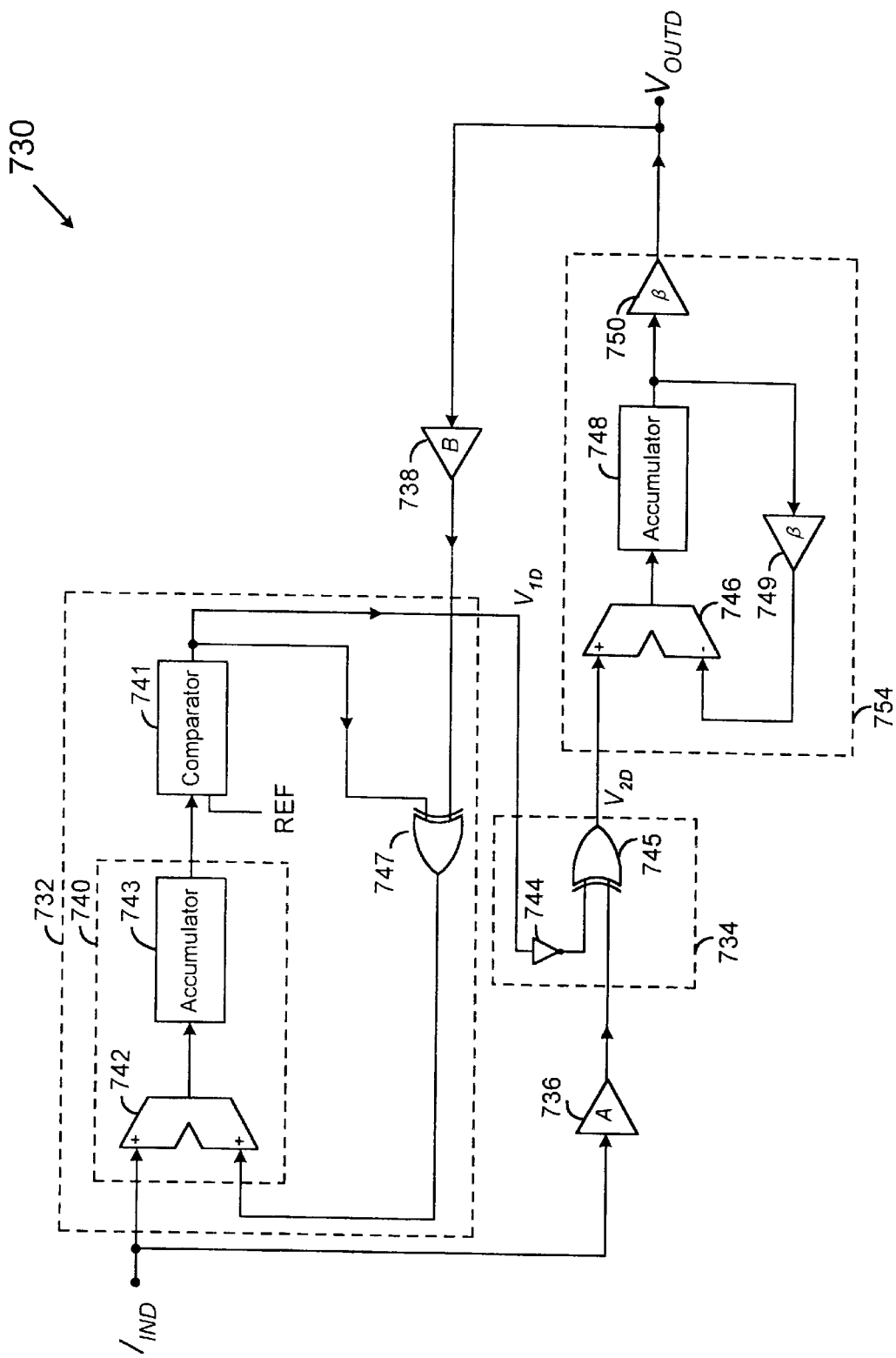
FIG. 16 is a more detailed schematic diagram of the RMS-to-DC converter circuit of FIG. 15.

FIG. 16 illustrates a more detailed block diagram of the circuit of FIG. 15. Digital modulator 732 includes digital integrator 740, comparator 741 and exclusive-OR gate 747. Digital integrator 740 has a first input coupled to $V_{IND}$, a second input coupled to the output of exclusive-OR gate 747, and an output coupled to a first input of comparator 741. Digital integrator 740, for example, may be a multi-bit integrator, and may receive at its first and second input signals 12-bit input signals (11 magnitude bits plus 1 sign bit), and may provide a 12-bit output (11 magnitude bits plus 1 sign bit).

Comparator 741 has a second input coupled to digital reference signal REF, and provides an output $V_{1D}$. Comparator 741, for example, may be a multi-bit comparator, and may receive at its first input a 13-bit input signal (12 magnitude bits plus 1 sign bit). REF, for example, may be a digital signal that corresponds to 0 volts. Comparator 741 compares the signal at the first input with REF at its second input, and provides a 1-bit output $V_{1D}$ equal to the comparison result.

Exclusive-OR gate 747 has a first input coupled to $V_{1D}$ and a second input coupled to the output of digital gain stage 738. Exclusive-OR gate 747, for example, may be a multi-bit exclusive-OR gate, and may receive a 1-bit control signal $V_{1D}$ at its first input, a 12-bit input signal at its second input (11 magnitude bits plus 1 sign bit), and may provide a 12-bit output signal (11 magnitude bits plus 1 sign bit). If $V_{1D}$ is logic LOW (e.g., 0 volts), exclusive-OR gate 747 provides an output equal to the signal at its second input. If, however, $V_{1D}$ is logic HIGH (e.g., 5 volts), exclusive-OR gate 747 provides an output equal to the complement of the signal at its second input.

Digital integrator 740 includes digital adder 742 and accumulator 743. Digital adder 742 has a first input coupled to $V_{IND}$, a second input coupled to the output of exclusive-OR gate 747, and an output coupled to the input of accumulator 743. Digital adder 742, for example, may be a multi-bit adder, and may receive a 10-bit input signal at its first input (9 magnitude bits plus 1 sign bit), a 12-bit input signal at its second input (11 magnitude bits plus 1 sign bit), and may provide a 12-bit output signal to accumulator 743.

Figure 17:
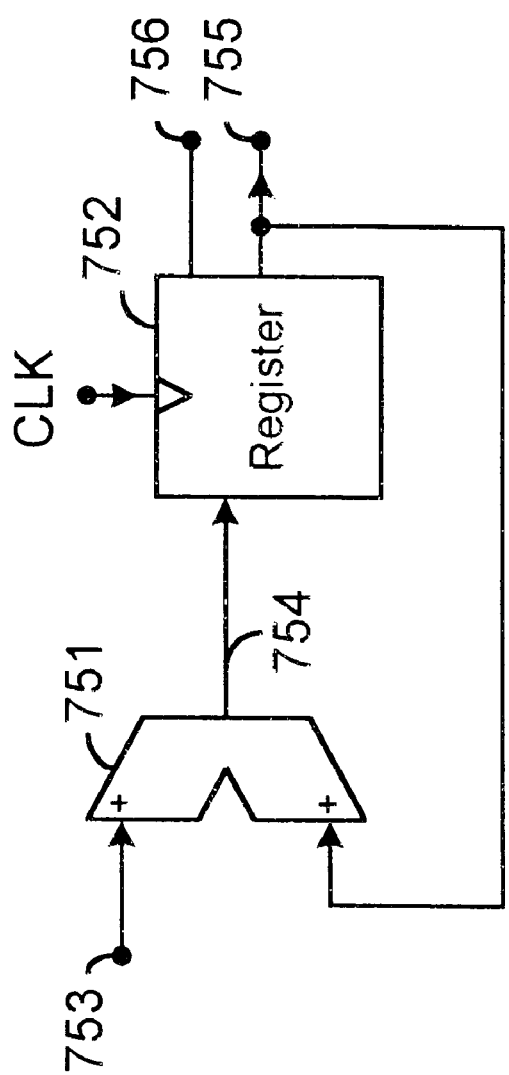
FIG. 17 is a schematic diagram of an illustrative accumulator circuit of the RMS-to-DC converter circuit of FIG. 16.

Accumulator 743 has an output coupled to the first input of comparator 741. Accumulator 743, for example, may be a multi-bit accumulator, and may receive a 12-bit input signal (11 magnitude bits plus 1 sign bit) and may provide a 13 bit output signal (12 magnitude bits plus 1 sign bit) (as such, accumulator 743 commonly is referred to as a 13-bit accumulator). FIG. 17 illustrates an exemplary embodiment of accumulator 743, which includes digital adder 751 and register 752. Digital adder 751 has a first input 753, a second input coupled to output 755 of register 752, and an output 754. Register 752 includes sign bit 756.

Digital adder 751, for example, may be a multi-bit adder, and may receive 13 bit input signals at its first and second inputs (12 magnitude bits plus 1 sign bit), and may provide a 13 bit output signal (12 magnitude bits plus 1 sign bit). Register 752 has an input coupled to output 754 of digital adder 751, and a clock input coupled to clock signal CLK. On each pulse of clock signal CLK, output 755 equals the sum of first input 753 and the previous value of output 755. Register 752, for example, may be a multi-bit register, and may receive a 13-bit input signal (12 magnitude bits plus 1 sign bit), and may provide a 13-bit output signal (12 magnitude bits plus 1 sign bit).

Referring again to FIG. 16, to simplify the description of digital modulator 732 and digital demodulator 734, the following discussion assumes that A=B=1. This assumption only affects a scale factor in the resulting analysis. If $V_{1D}$ is LOW (assuming B=1), $+V_{OUTD}$ is coupled to the second input of integrator 740. Alternatively, if $V_{1D}$ is HIGH (assuming B=1), $-V_{OUTD}$ (in 1's complement logic) is coupled to the second input of integrator 740. (For 2's complement logic, $V_{1D}$ can be coupled to a carry-in input of adder 742). This configuration provides negative feedback in pulse modulator 732.

The first and second inputs of Δ-Σ stage 740 therefore can have values equal to:

$$-V_{OUTD} \leq V_{IND} \leq +V_{OUTD} \tag{54}$$

and $V_{IND}$ thus has a bipolar input signal range without requiring an absolute value circuit.

From equation (54), if $V_{1D}$ has a duty ratio $D_D$ between 0–100%, $D_D$ can be expressed as:

$$D_D = \frac{1}{2} \times \left(\frac{V_{IND}}{V_{OUTD}} + 1\right), \ 0 \leq D_D \leq 1 \tag{55}$$

That is, if $V_{IND} = -V_{OUTD}$, $D_D = 0$, and if $V_{IND} = +V_{OUTD}$, $D_D = 1$.

Digital demodulator 734 includes inverter 744 and exclusive-OR gate 745. Inverter 744 has an input coupled to output $V_{1D}$ and an output coupled to a first input of exclusive-OR gate 745. Exclusive-OR gate 745 has a second input coupled to the output of gain stage 736, and an output $V_{2D}$ coupled to the input of digital lowpass filter 754. Exclusive-OR gate 745, for example, may be a multi-bit exclusive-OR gate, and may receive a 1-bit control signal at its first input, a 10-bit input signal at its second input (9 magnitude bits plus 1 sign bit), and may provide a 10-bit output signal (9 magnitude bits-plus 1 sign bit).

If $V_{1D}$ is LOW, exclusive-OR gate 745 provides an output equal to the complement of the signal at its second input. If, however, $V_{1D}$ is HIGH, exclusive-OR gate 747 provides an output equal to the signal at its second input. Thus, if $V_{1D}$ is HIGH (and assuming C=1), output $V_{2D} = +V_{IND}$ is coupled to the input of lowpass filter 754. Alternatively, if $V_{1D}$ is LOW, output $V_{2D} = -V_{IND}$ is coupled to the input of lowpass filter 754.

$V_{2D}$ may be expressed as:

$$V_{2D} = +V_{IND} \times D_D - (-V_{IND}) \times (D_D - 1) \tag{56a}$$

$$= V_{IND} \times (2 \times D_D - 1) \tag{56b}$$

Substituting equation (55) into equation (56b), $V_{2D}$ is given by:

$$V_{2D} = \frac{V_{IND}^2}{V_{OUTD}} \tag{57}$$

If REF is a digital signal equal to 0, $V_{1D}$ is HIGH if the output of accumulator 743 is greater than or equal to 0, and is LOW if the output of accumulator 743 is less than 0. Accordingly, if REF=0, the circuit of FIG. 16 can be simplified to the circuit shown in FIG. 18. Circuit 830 is similar to circuit 730, except that comparator 741 has been eliminated from digital modulator 832, inverter 744 has been eliminated from digital demodulator 834, and inverter 844 has been added to digital modulator 832. In addition, sign bit 756 of accumulator 743 is coupled directly to the first input of exclusive-OR gate 745 and to the input of inverter 844, and the output of inverter 844 is coupled to the first input of exclusive-OR gate 747.

If the value stored in output 755 of accumulator 743 (FIG. 17) is greater than or equal to zero, sign bit 756 of accumulator 743 is LOW. Otherwise, if the value stored in output 755 of accumulator 743 is less than zero, sign bit 756 of accumulator 743 is HIGH. Thus, sign bit 765 of accumulator 743 may be used as the complement $\overline{V_{1D}}$ of signal $V_{1D}$.

Referring again to FIG. 16, digital lowpass filter 754 includes subtractor 746, accumulator 748, and gain stages 749 and 750. Subtractor 746 has a first input coupled to $V_{2D}$, a second input coupled to the output of gain stage 749, and an output coupled to the input of accumulator 748. Accumulator 748 has an output coupled to the input of gain stage 749 and the input of gain stage 750. Accumulator 748, for example, may be a multi-bit accumulator, such as a 24-bit accumulator. Gain stage 750 has an output $V_{OUTD}$, and gain stages 749 and 750 have gains of β. Digital lowpass filter 754 has an output $V_{OUTD}$ that may be expressed as:

$$V_{OUTD}(n) = V_{OUTD}(n-1) + \beta[V_{2D}(n-1) - V_{OUTD}(n-1)] \tag{58}$$

The z-domain transfer function H(z) of lowpass filter 754 is:

$$H(z) = \frac{\beta}{z - (1 - \beta)} \tag{59}$$

Gain β therefore may be used to set the corner frequency of lowpass filter 754. If β is a power of 2, (e.g., $\beta = 2^{-N}$), gain stages 749 and 750 may be implemented by shifting the binary point of the signal at the output of accumulator 748 left N bits.

Lowpass filter 754 provides an output $V_{OUTD}$ equal to the time average of input $V_{2D}$. Accordingly, $V_{OUTD}$ equals:

$$V_{OUTD} = \sqrt{\overline{V_{IND}^2}} \tag{60}$$

Thus, circuit 730 (and circuit 830 in FIG. 18) has a bipolar input range and provides an output $V_{OUTD}$ equal to the RMS value of input $V_{IND}$.

Figure 18:
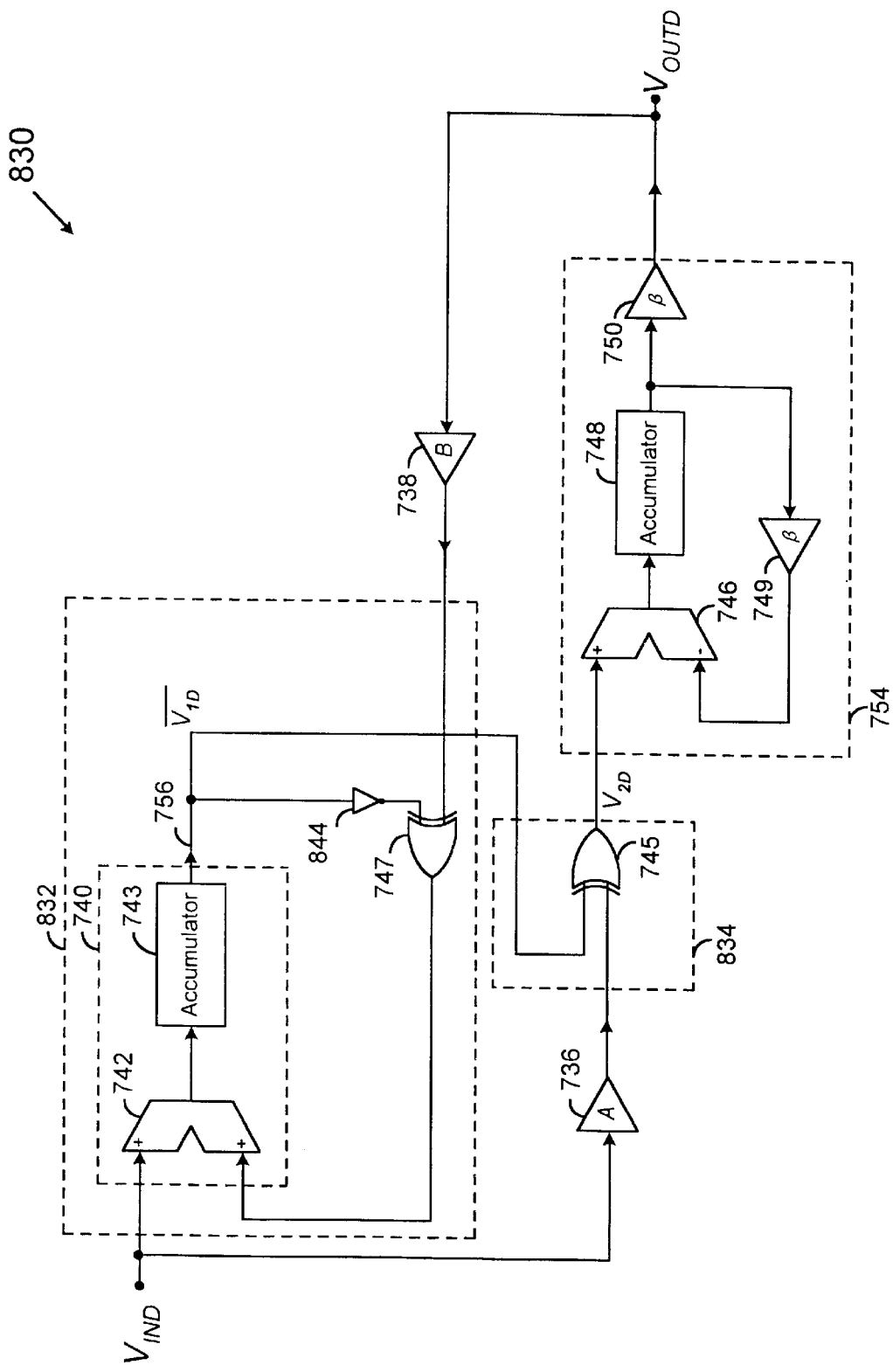
FIG. 18 is a schematic diagram of an alternative embodiment of the RMS-to-DC converter circuit of FIG. 16.

Gain stages 736 and 738 may be used to adjust the overall gain and crest factor limit for circuit 730 (and circuit 830 in FIG. 18). For non-unity values of A and B, $V_{OUTD}$ can be written as:

$$V_{OUTD} = A \times \overline{V_{IND} \times \frac{V_{IND}}{B \times V_{OUTD}}} \tag{61}$$

$$= \frac{A}{B} \times \frac{\overline{V_{IND}^2}}{V_{OUTD}} \tag{62}$$

Therefore, $V_{OUTD}$ is given by:

$$V_{OUTD} = \sqrt{\frac{A}{B}} \times \sqrt{\overline{V_{IND}^2}} \tag{63}$$

$$= \sqrt{\frac{A}{B}} \times V_{RMS} \tag{64}$$

By setting A=B, the overall gain of circuit 730 substantially equals unity (1.0). Alternatively, the overall gain of circuit 730 may be set substantially equal to another integer value by setting the ratio A/B equal to an integer squared.

If gain value A equals a power of two (e.g., $A = 2^K$), gain stage 736 may be implemented by shifting the binary point of the signal at the second input of exclusive-OR gate 754 right K bits. Similarly, if gain value B equals a power of two (e.g., $B = 2^M$), gain stage 738 may be implemented by shifting the binary point of the signal at the second input of exclusive-OR gate 747 right M bits.

As with the embodiments of FIGS. 12–14, delay compensation can be added to digital embodiments of RMS-to-DC converters of this invention. For example, delay compensation can be added to the circuits of FIGS. 16 and 18 by adding a 1 clock-cycle delay stage before gain stage 736.

As an alternative to using digital circuits, RMS-to-DC converters of this invention may be implemented using a digital signal processor integrated circuit (e.g., the TMS320C25 digital signal processor manufactured by Texas Instruments, Inc., Dallas, Tex.) programmed to perform the modulation, demodulation and lowpass filtering operations described above.

Persons skilled in the art will recognize that the apparatus of the present invention may be implemented using circuit configurations other than those shown and discussed above. All such modifications are within the scope of the present invention, which is limited only by the claims that follow.

I claim:

1. A circuit that generates an output signal at an output node proportional to a root-mean-square (RMS) value of an input signal at an input node, the circuit comprising:

a pulse code modulator circuit comprising an integrator circuit coupled to the input node, a comparator circuit coupled to an output of the integrator circuit, and a first multiplying digital-to-analog converter (MDAC) coupled to an output of the comparator circuit and to the output node, the first MDAC further comprising a first non-inverting buffer circuit and a first inverting buffer circuit each having an input coupled to the output node and an output coupled via a first switch circuit to the integrator circuit, the first switch circuit having a control terminal coupled to the output of the comparator circuit; and a demodulator circuit comprising a second MDAC having a second non-inverting buffer circuit and a second inverting buffer circuit each having an input coupled to the input node and an output coupled via a second switch circuit to the output node, the second switch circuit having a control terminal coupled to the output of the comparator circuit.

2. The circuit of claim 1 further comprising:

a first gain circuit coupled to the second MDAC and to the output node, the first gain circuit providing a first gain; and a second gain circuit coupled to the first MDAC and to the output node, the second gain circuit providing a second gain.

3. The circuit of claim 2, wherein a ratio of the first and second gains substantially equals an integer value.

4. The circuit of claim 2, wherein a ratio of the first and second gains substantially equals unity (1.0).

5. The circuit of claim 2, wherein the first and second gains each are substantially irrational.

6. The circuit of claim 1 further comprising:

a first gain circuit coupled to the second MDAC and to the input node, the first gain circuit providing a first gain; and a second gain circuit coupled to the first MDAC and to the output node, the second gain circuit providing a second gain.

7. The circuit of claim 6, wherein a ratio of the first and second gains substantially equals an integer value.

8. The circuit of claim 6, wherein a ratio of the first and second gains substantially equals unity (1.0).

9. The circuit of claim 6, wherein the first and second gains each are substantially irrational.

10. The circuit of claim 1 further comprising:

a first gain circuit coupled to the second MDAC and to the output node, the first gain circuit providing a first gain; and a second gain circuit coupled to the first MDAC and to the input node, the second gain circuit providing a third gain.

11. The circuit of claim 10, wherein a product of the first and third gains substantially equals an integer value.

12. The circuit of claim 10, wherein a product of the first and third gains substantially equals unity (1.0).

13. The circuit of claim 10, wherein the first and third gains each are substantially irrational.

14. The circuit of claim 1 further comprising:

a first gain circuit coupled to the second MDAC and to the input node, the first gain circuit providing a first gain; and a second gain circuit coupled to the first MDAC and to the input node, the second gain circuit providing a third gain.

15. The circuit of claim 14, wherein a product of the first and third gains substantially equals an integer value.

16. The circuit of claim 14, wherein a product of the first and third gains substantially equals unity (1.0).

17. The circuit of claim 14, wherein the first and third gains each are substantially irrational.

18. The circuit of claim 1, wherein the pulse code modulator circuit comprises a single-bit pulse code modulator circuit.

19. The circuit of claim 1, wherein the pulse code modulator circuit comprises a multi-bit pulse code modulator circuit.

20. The circuit of claim 1, wherein the pulse code modulator circuit comprises a $\Delta$-$\Sigma$ pulse code modulator circuit.

21. The circuit of claim 1, wherein the pulse code modulator circuit comprises a cascaded $\Delta$-$\Sigma$ pulse code modulator circuit.

22. The circuit of claim 1 comprising switched-capacitor circuitry.

23. The circuit of claim 1 comprising digital circuitry.

24. The circuit of claim 1 comprising a single integrated circuit.

25. The circuit of claim 1 comprising complementary metal-oxide semiconductor circuitry.

26. The circuit of claim 1 further comprising a first delay stage circuit coupled to the input node and to the demodulator circuit.

27. A circuit that generates an output signal at an output node proportional to a root-mean-square (RMS) value of an input signal at an input node, the circuit comprising:

a pulse width modulator circuit comprising a comparator circuit coupled to the input node, and a sawtooth generator circuit coupled to the output node and to an input of the comparator circuit; and a demodulator circuit comprising a multiplying digital-to-analog converter (MDAC) having a non-inverting buffer circuit and an inverting buffer circuit each having an input coupled to the input node and an output coupled via a switch circuit to the output node, the switch circuit having a control terminal coupled to an output of the comparator circuit.

28. The circuit of claim 27 further comprising:

a first gain circuit coupled to the MDAC and to the output node, the first gain circuit providing a first gain; and a second gain circuit coupled to the sawtooth generator circuit and to the output node, the second gain circuit providing a second gain.

29. The circuit of claim 28, wherein a ratio of the first and second gains substantially equals an integer value.

30. The circuit of claim 28, wherein a ratio of the first and second gains substantially equals unity (1.0).

31. The circuit of claim 28, wherein the first and second gains each are substantially irrational.

32. The circuit of claim 27 further comprising:
a first gain circuit coupled to the MDAC and to the input node, the first gain circuit providing a first gain; and
a second gain circuit coupled to the sawtooth generator circuit and to the output node, the second gain circuit providing a second gain.

33. The circuit of claim 32, wherein a ratio of the first and second gains substantially equals an integer value.

34. The circuit of claim 32, wherein a ratio of the first and second gains substantially equals unity (1.0).

35. The circuit of claim 32, wherein the first and second gains each are substantially irrational.

36. The circuit of claim 27 further comprising:
a first gain circuit coupled to the MDAC and to the output node, the first gain circuit providing a first gain; and
a second gain circuit coupled to the comparator circuit and to the input node, the second gain circuit providing a third gain.

37. The circuit of claim 36, wherein a product of the first and third gains substantially equals an integer value.

38. The circuit of claim 36, wherein a product of the first and third gains substantially equals unity (1.0).

39. The circuit of claim 36, wherein the first and third gains each are substantially irrational.

40. The circuit of claim 27 further comprising:
a first gain circuit coupled to the MDAC and to the input node, the first gain circuit providing a first gain; and
a second gain circuit coupled to the comparator circuit and to the input node, the second gain circuit providing a third gain.

41. The circuit of claim 40, wherein a product of the first and third gains substantially equals an integer value.

42. The circuit of claim 40, wherein a product of the first and third gains substantially equals unity (1.0).

43. The circuit of claim 40, wherein the first and third gains each are substantially irrational.

44. The circuit of claim 27 comprising switched-capacitor circuitry.

45. The circuit of claim 27 comprising digital circuitry.

46. The circuit of claim 27 comprising a single integrated circuit.

47. The circuit of claim 27 comprising complementary metal-oxide semiconductor circuitry.

48. A circuit that generates a differential output signal at differential output nodes proportional to a root-mean-square (RMS) value of a differential input signal at differential input nodes, the circuit comprising:
a pulse code modulator circuit comprising an integrator circuit having first differential inputs coupled to the differential input nodes, a comparator circuit coupled to differential outputs of the integrator circuit, and a first crosspoint switch circuit coupled to the differential output nodes and to second differential inputs of the integrator circuit, the first crosspoint switch circuit further comprising a control terminal coupled to an output of the comparator circuit; and
a demodulator circuit comprising a second crosspoint switch circuit coupled to the differential input nodes and to the differential output nodes, the second crosspoint switch circuit further comprising a control terminal coupled to the output of the comparator circuit.

49. The circuit of claim 48 further comprising:
a first gain circuit coupled to the second crosspoint switch circuit and to the differential output nodes, the first gain circuit providing a first gain; and
a second gain circuit coupled to the first crosspoint switch circuit and to the differential output nodes, the second gain circuit providing a second gain.

50. The circuit of claim 49, wherein a ratio of the first and second gains substantially equals an integer value.

51. The circuit of claim 49, wherein a ratio of the first and second gains substantially equals unity (1.0).

52. The circuit of claim 49, wherein the first and second gains each are substantially irrational.

53. The circuit of claim 48 further comprising:
a first gain circuit coupled to the second crosspoint switch circuit and to the input node, the first gain circuit providing a first gain; and
a second gain circuit coupled to the first crosspoint switch circuit and to the output node, the second gain circuit providing a second gain.

54. The circuit of claim 53, wherein a ratio of the first and second gains substantially equals an integer value.

55. The circuit of claim 53, wherein a ratio of the first and second gains substantially equals unity (1.0).

56. The circuit of claim 53, wherein the first and second gains each are substantially irrational.

57. The circuit of claim 48 further comprising:
a first gain circuit coupled to the second crosspoint switch circuit and to the output node, the first gain circuit providing a first gain; and
a second gain circuit coupled to the first crosspoint switch circuit and to the input node, the second gain circuit providing a third gain.

58. The circuit of claim 57, wherein a product of the first and third gains substantially equals an integer value.

59. The circuit of claim 57, wherein a product of the first and third gains substantially equals unity (1.0).

60. The circuit of claim 57, wherein the first and third gains each are substantially irrational.

61. The circuit of claim 48 further comprising:
a first gain circuit coupled to the second crosspoint switch circuit and to the input node, the first gain circuit providing a first gain; and
a second gain circuit coupled to the first crosspoint switch circuit and to the input node, the second gain circuit providing a third gain.

62. The circuit of claim 61, wherein a product of the first and third gains substantially equals an integer value.

63. The circuit of claim 61, wherein a product of the first and third gains substantially equals unity (1.0).

64. The circuit of claim 61, wherein the first and third gains each are substantially irrational.

65. The circuit of claim 48, wherein the pulse code modulator circuit comprises a multi-bit pulse code modulator circuit.

66. The circuit of claim 48, wherein the pulse code modulator circuit comprises a $\Delta\text{-}\Sigma$ pulse code modulator circuit.

67. The circuit of claim 48, wherein the pulse code modulator circuit comprises a cascaded $\Delta\text{-}\Sigma$ pulse code modulator.

68. The circuit of claim 48 comprising switched-capacitor circuitry.

69. The circuit of claim 48 comprising digital circuitry.

70. The circuit of claim 48 comprising a single integrated circuit.

71. The circuit of claim 48 comprising complementary metal-oxide semiconductor circuitry.

72. The circuit of claim 48 further comprising a first delay stage circuit coupled to the differential input nodes and to the demodulator circuit.

73. A circuit that generates an output signal at an output node proportional to a root-mean-square (RMS) value of an input signal at an input node, the circuit comprising:

a pulse code modulator circuit comprising a first delta-sigma modulator circuit coupled to the input node and to the output node, a second delta-sigma modulator circuit coupled to a first output of the first delta-sigma modulator circuit and to the output node, a first delay circuit coupled to a second output of the first delta-sigma modulator circuit, and a digital differentiator circuit coupled to an output of the second delta-sigma modulator circuit;

a second delay circuit coupled to the input node;

a demodulator circuit comprising a 1-bit multiplying digital to analog converter (MDAC) circuit coupled to an output of the second delay circuit and to an output of the first delay circuit, a 1.5-bit MDAC circuit coupled to an output of the second delay circuit and to an output of the digital differentiator circuit, and a subtractor circuit coupled to an output of the 1-bit MDAC circuit, an output of the 1.5-bit MDAC circuit, and the output node.

74. The circuit of claim 73 comprising switched-capacitor circuitry.

75. The circuit of claim 73 comprising a single integrated circuit.

76. The circuit of claim 73 comprising complementary metal-oxide semiconductor circuitry.

77. A circuit that generates an output signal at an output node proportional to a root-mean-square (RMS) value of an input signal at an input node, the circuit comprising:

a pulse code modulator circuit comprising a first delta-sigma modulator circuit coupled to the input node and to the output node, and a second delta-sigma modulator coupled to a first output of the first delta-sigma modulator circuit and to the output node;

a first delay circuit coupled to the input node;

a second delay circuit coupled to an output of the first delay circuit;

a demodulator circuit comprising a first 1-bit multiplying digital-to-analog-converter (MDAC) circuit coupled to the output of the first delay circuit and to a second output of the first delta-sigma modulator circuit, a second 1-bit MDAC circuit coupled to the output of the first delay circuit and to an output of the second delta-sigma modulator circuit, a third 1-bit MDAC circuit coupled to an output of the second delay circuit and the output of the second delta-sigma modulator circuit, and a subtractor circuit coupled to an output of each of the first, second and third 1-bit MDAC circuits and to the output node.

78. The circuit of claim 77 comprising switched-capacitor circuitry.

79. The circuit of claim 77 comprising a single integrated circuit.

80. The circuit of claim 77 comprising complementary metal-oxide semiconductor circuitry.

81. A circuit that generates an output signal at an output node proportional to a root-mean-square (RMS) value of an input signal at an input node, the circuit comprising:

a pulse code modulator circuit comprising a first delta-sigma modulator circuit coupled to the input node and to the output node, a second delta-sigma modulator circuit coupled to a first output of the first delta-sigma modulator circuit and to the output node, and a digital differentiator circuit coupled to an output of the second delta-sigma modulator circuit;

a first delay circuit coupled to the input node;

a second delay circuit coupled to an output of the first delay circuit;

a demodulator circuit comprising a 1-bit multiplying digital-to-analog-converter (MDAC) circuit coupled to the output of the first delay circuit and to a second output of the first delta-sigma modulator circuit, a 1.5-bit MDAC circuit coupled to an output of the second delay circuit and an output of the digital differentiator circuit, and a subtractor circuit coupled to an output of the 1-bit MDAC circuit, an output of the 1.5-bit MDAC circuit, and to the output node.

82. The circuit of claim 81 comprising switched-capacitor circuitry.

83. The circuit of claim 81 comprising a single integrated circuit.

84. The circuit of claim 81 comprising complementary metal-oxide semiconductor circuitry.

85. A method for generating an output signal at an output terminal proportional to a root-mean-square (RMS) value of an input signal at an input terminal, the method comprising:

coupling the input signal at the input terminal to a first input terminal of a modulator circuit and an input terminal of a demodulator circuit;

in the demodulator circuit, amplifying the coupled input signal by an inverting gain and a non-inverting gain;

using an output of the modulator circuit to select the inverted or non-inverted coupled input signal as an output signal of the demodulator circuit;

filtering the output signal of the demodulator circuit to provide the output signal at the output terminal;

coupling the output signal at the output terminal to a second input terminal of the modulator circuit;

in the modulator circuit, amplifying the coupled output signal by an inverting gain and a non-inverting gain; and in the modulator circuit, using the output of the modulator circuit to select the inverted or non-inverted coupled output signal to integrate with the coupled input signal.

86. A method for providing a differential output signal at differential output terminals proportional to a root-mean-square (RMS) value of a differential input signal at differential input terminals, the method comprising:

coupling the differential input signal at the differential input terminals to first differential input terminals of a modulator circuit and differential input terminals of a demodulator circuit;

in the demodulator circuit, using an output of the modulator circuit to control cross-coupling the coupled differential input signal to provide a differential output signal of the demodulator circuit;

filtering the differential output signal of the demodulator circuit to provide the differential output signal at the differential output terminals;

coupling the differential output signal at the differential output terminals to second differential input terminals of the modulator circuit; and in the modulator circuit, using the output of the modulator circuit to control cross-coupling of the coupled differential output signal to integrate with the coupled differential input signal.

* * * * *